US010462907B2

United States Patent
Lewis et al.

(10) Patent No.: US 10,462,907 B2
(45) Date of Patent: Oct. 29, 2019

(54) PRINTED THREE-DIMENSIONAL (3D) FUNCTIONAL PART AND METHOD OF MAKING

(71) Applicant: President and Fellows of Harvard College, Cambridge, MA (US)

(72) Inventors: Jennifer A. Lewis, Cambridge, MA (US); Michael A. Bell, Somerville, MA (US); Travis A. Busbee, Somerville, MA (US); John E. Minardi, II, Somerville, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 224 days.

(21) Appl. No.: 14/900,860

(22) PCT Filed: Jun. 24, 2014

(86) PCT No.: PCT/US2014/043860
§ 371 (c)(1),
(2) Date: Dec. 22, 2015

(87) PCT Pub. No.: WO2014/209994
PCT Pub. Date: Dec. 31, 2014

(65) Prior Publication Data
US 2016/0198576 A1   Jul. 7, 2016

Related U.S. Application Data

(60) Provisional application No. 61/838,714, filed on Jun. 24, 2013.

(51) Int. Cl.
*H05K 3/00* (2006.01)
*H05K 3/12* (2006.01)
(Continued)

(52) U.S. Cl.
CPC .............. *H05K 3/125* (2013.01); *B29C 64/00* (2017.08); *B29C 64/106* (2017.08); *B29C 70/72* (2013.01);
(Continued)

(58) Field of Classification Search
CPC .... H05K 1/021; H05K 1/0212; H05K 1/0215; H05K 1/023; H05K 1/0231;
(Continued)

(56) References Cited

U.S. PATENT DOCUMENTS 5,264,061 A   11/1993   Juskey et al.
5,303,141 A   4/1994    Batchelder et al.
(Continued)

FOREIGN PATENT DOCUMENTS

CA   2 412 481        12/2002
CN   102448728 A      5/2012
(Continued)

OTHER PUBLICATIONS

International Search Report and Written Opinion for International Patent Application No. PCT/US2014/043860 dated Jan. 21, 2015, 10 pp.
(Continued)

*Primary Examiner* — Pete T Lee
(74) *Attorney, Agent, or Firm* — Brinks Gilson & Lione

(57) ABSTRACT

A printed 3D functional part includes a 3D structure comprising a structural material, and at least one functional electronic device is at least partially embedded in the 3D structure. The functional electronic device has a base secured against an interior surface of the 3D structure. One or more conductive filaments are at least partially embedded in the 3D structure and electrically connected to the at least one functional electronic device.

21 Claims, 22 Drawing Sheets

(51) Int. Cl.
| | |
|---|---|
| H01L 23/13 | (2006.01) |
| H01L 21/48 | (2006.01) |
| H01L 23/31 | (2006.01) |
| H01L 21/56 | (2006.01) |
| H01L 23/498 | (2006.01) |
| H01L 23/538 | (2006.01) |
| H01L 23/00 | (2006.01) |
| H05K 1/02 | (2006.01) |
| H01L 25/065 | (2006.01) |
| H01L 25/00 | (2006.01) |
| B33Y 80/00 | (2015.01) |
| B33Y 10/00 | (2015.01) |
| H01M 4/04 | (2006.01) |
| H05K 7/02 | (2006.01) |
| B29C 70/72 | (2006.01) |
| H04R 25/00 | (2006.01) |
| B29C 64/00 | (2017.01) |
| B29C 64/106 | (2017.01) |
| H01M 4/02 | (2006.01) |
| H05K 1/18 | (2006.01) |

(52) U.S. Cl.
CPC ............... *B33Y 10/00* (2014.12); *B33Y 80/00* (2014.12); *H01L 21/4803* (2013.01); *H01L 21/4867* (2013.01); *H01L 21/56* (2013.01); *H01L 23/13* (2013.01); *H01L 23/3107* (2013.01); *H01L 23/49822* (2013.01); *H01L 23/5389* (2013.01); *H01L 24/24* (2013.01); *H01L 24/27* (2013.01); *H01L 24/743* (2013.01); *H01L 24/75* (2013.01); *H01L 24/82* (2013.01); *H01L 24/83* (2013.01); *H01L 24/92* (2013.01); *H01L 25/065* (2013.01); *H01L 25/50* (2013.01); *H01M 4/0411* (2013.01); *H04R 25/658* (2013.01); *H05K 1/0284* (2013.01); *H05K 3/1241* (2013.01); *H05K 7/02* (2013.01); *H01L 21/568* (2013.01); *H01L 2224/24145* (2013.01); *H01L 2224/27312* (2013.01); *H01L 2224/75702* (2013.01); *H01L 2224/76155* (2013.01); *H01L 2224/83192* (2013.01); *H01L 2924/12041* (2013.01); *H01L 2924/14* (2013.01); *H01L 2924/1815* (2013.01); *H01M 2004/022* (2013.01); *H05K 1/185* (2013.01)

(58) Field of Classification Search
CPC .. H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/182; H05K 1/183; H05K 1/184; H05K 1/185; H05K 2201/0317; H05K 2201/041; H05K 2201/049; H05K 2201/009763; H05K 2201/09872; H05K 2201/10446; H05K 2201/10454; H05K 2201/10462; H05K 2201/10469; H05K 2201/10477; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46
See application file for complete search history.

(56) References Cited

U.S. PATENT DOCUMENTS

| | | | |
|---|---|---|---|
| 6,067,480 A | 5/2000 | Stuffle et al. | |
| 6,300,576 B1* | 10/2001 | Nakamura | H01L 21/4853 174/261 |
| 6,503,831 B2 | 1/2003 | Speakman | |
| 7,053,125 B2 | 5/2006 | Lewis et al. | |
| 7,141,617 B2 | 11/2006 | Gratson et al. | |
| 7,790,061 B2 | 9/2010 | Gratson et al. | |
| 7,799,251 B2 | 9/2010 | Therriault et al. | |
| 7,922,939 B2 | 4/2011 | Lewis et al. | |
| 7,956,102 B2 | 6/2011 | Lewis et al. | |
| 8,101,139 B2 | 1/2012 | Therriault et al. | |
| 8,187,500 B2 | 5/2012 | Lewis et al. | |
| 2004/0046250 A1* | 3/2004 | Chua | H01L 23/5389 257/723 |
| 2004/0145629 A1 | 7/2004 | Silverbrook | |
| 2005/0195124 A1* | 9/2005 | Puente Baliarda | H01Q 1/36 343/893 |
| 2008/0073784 A1* | 3/2008 | Lee | H01L 23/3121 257/738 |
| 2009/0114434 A1* | 5/2009 | Ko | H05K 3/38 174/258 |
| 2009/0233057 A1 | 9/2009 | Aksay et al. | |
| 2010/0295900 A1 | 11/2010 | Weir | |
| 2010/0330220 A1 | 12/2010 | Gratson et al. | |
| 2011/0309893 A1* | 12/2011 | Kawamura | H01L 23/48 333/104 |
| 2012/0217453 A1* | 8/2012 | Lowenthal | C09D 11/52 252/513 |
| 2013/0015596 A1 | 1/2013 | Mozeika et al. | |
| 2013/0084449 A1 | 4/2013 | Lewis et al. | |
| 2014/0002325 A1* | 1/2014 | Matsushita | H05K 1/165 343/870 |
| 2014/0314954 A1 | 10/2014 | Lewis et al. | |
| 2015/0016070 A1* | 1/2015 | Chang | H05K 1/0296 361/748 |
| 2015/0090573 A1* | 4/2015 | Mansky | H03K 17/9618 200/5 R |

FOREIGN PATENT DOCUMENTS

| | | |
|---|---|---|
| EP | 2457719 A1 | 5/2012 |
| JP | H05-345359 A | 12/1993 |
| JP | 2003-534826 A | 11/2003 |
| WO | WO 2011/025676 A1 | 3/2011 |
| WO | WO 2011/025780 A1 | 3/2011 |
| WO | WO 2012/143923 A2 | 10/2012 |
| WO | WO 2013/030064 A1 | 3/2013 |
| WO | WO 2013/096664 A1 | 6/2013 |
| WO | WO 2013/103600 A1 | 7/2013 |
| WO | WO 2014/182535 A1 | 11/2014 |

OTHER PUBLICATIONS

Translation of Office Action dated Sep. 13, 2017 for related Chinese Patent Application No. 201480041302.1.
Ahn, Bok Y. et al., "Omnidirectional Printing of Flexible, Stretchable, and Spanning Silver Microelectrodes," *Science*, 323 (2009) pp. 1590-1593.
Gratson, Gregory M. et al. "Direct Writing of Three-Dimensional Webs," *Nature*, 428 (2004) p. 386.
Lewis, Jennifer A., "Colloidal Processing of Ceramics," *Journal of the American Ceramic Society*, 83, 10 (2000) pp. 2341-2359.
Lewis, Jennifer A. "Direct Ink Writing of 3D Functional Materials," *Adv. Funct. Mater*, 16 (2006) pp. 2193-2204.
Sun, Ke et al., "3D Printing of Interdigitated Li-Ion Microbattery," *Adv. Mater*. 25 (2013) pp. 4539-4543.
Therriault, Daniel et al., "Rheological Behavior of Fugitive Organic Inks for Direct-Write Assembly," *Applied Rheology*, 17, 1 (2007) pp. 10112-1-10112-8.
Walker, Brett S. et al., "Reactive Silver Inks for Patterning High-Conductivity Features at Mild Temperatures," *J. Am. Chem. Soc.* 134, (2012) pp. 1419-1421.
Wu, Willie, et al., "Omnidirectional Printing of 3D Microvascular Networks," *Advanced Materials*, 23, 24 (2011) pp. H178-H183.
Singapore Search Report (3 pages) and Written Opinion (5 pages) for Singapore Patent Application No. 11201510615S, dated Dec. 13, 2016.

(56) References Cited

OTHER PUBLICATIONS

Translation of Third Office Action dated Feb. 5, 2018 for related Chinese Patent Application No. 201480041302.1.
Translation of Office Action dated Aug. 9, 2018 for related Chinese Patent Application No. 201480041302.1. (4 pp.).
Translation of Office Action dated Aug. 2, 2018 for related Japanese Patent Application No. 2016-523851 (2 pp.).
Extended European Search Report for European Patent Application No. 14817282.8, dated Feb. 7, 2017.

* cited by examiner

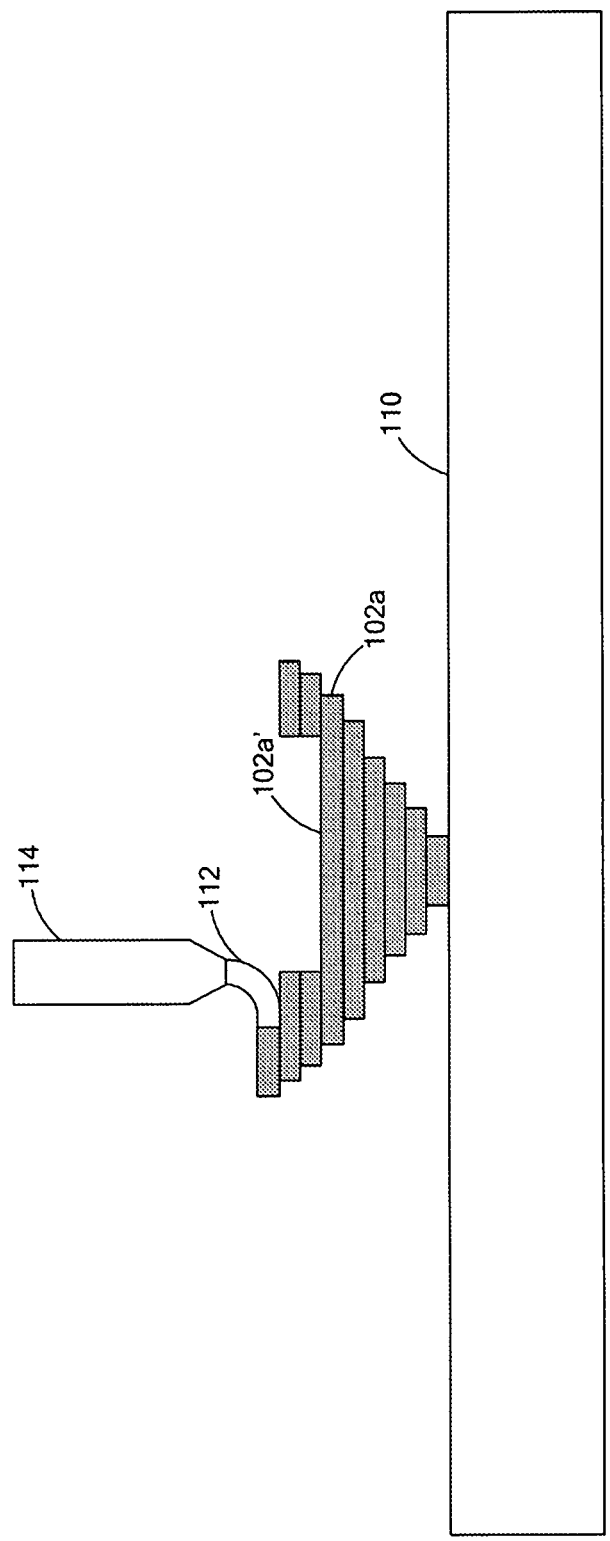

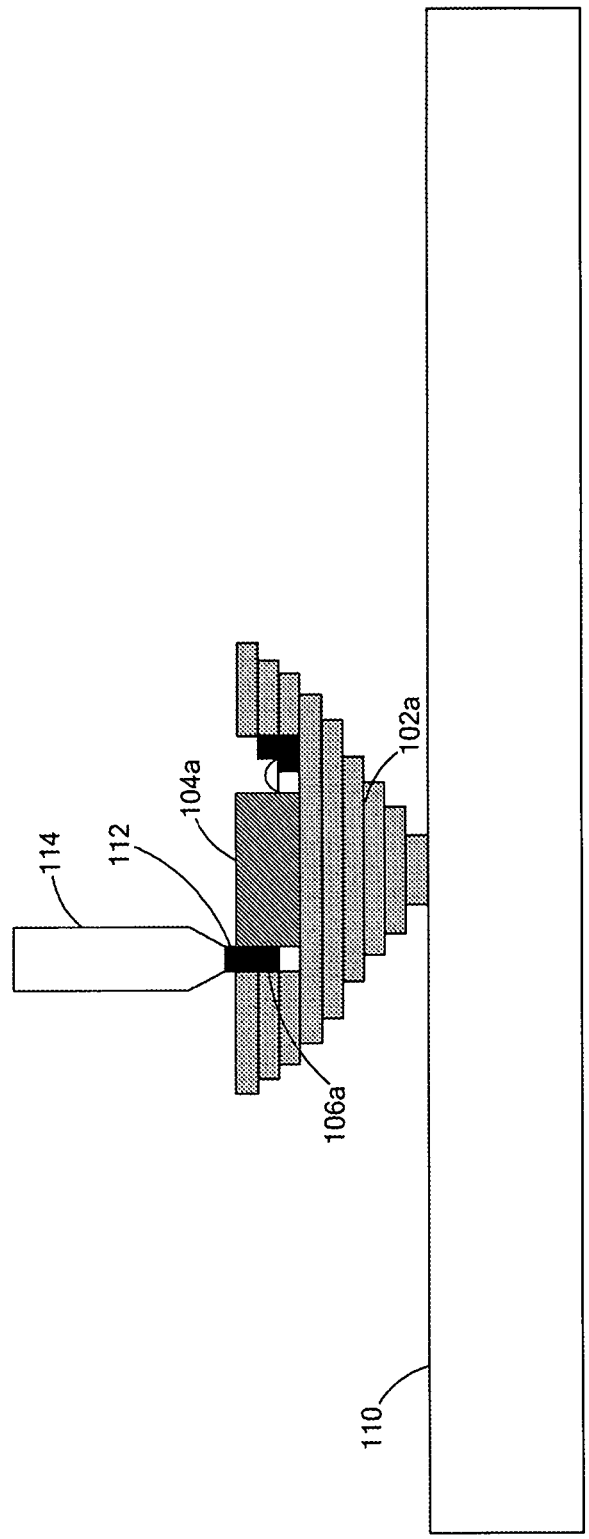

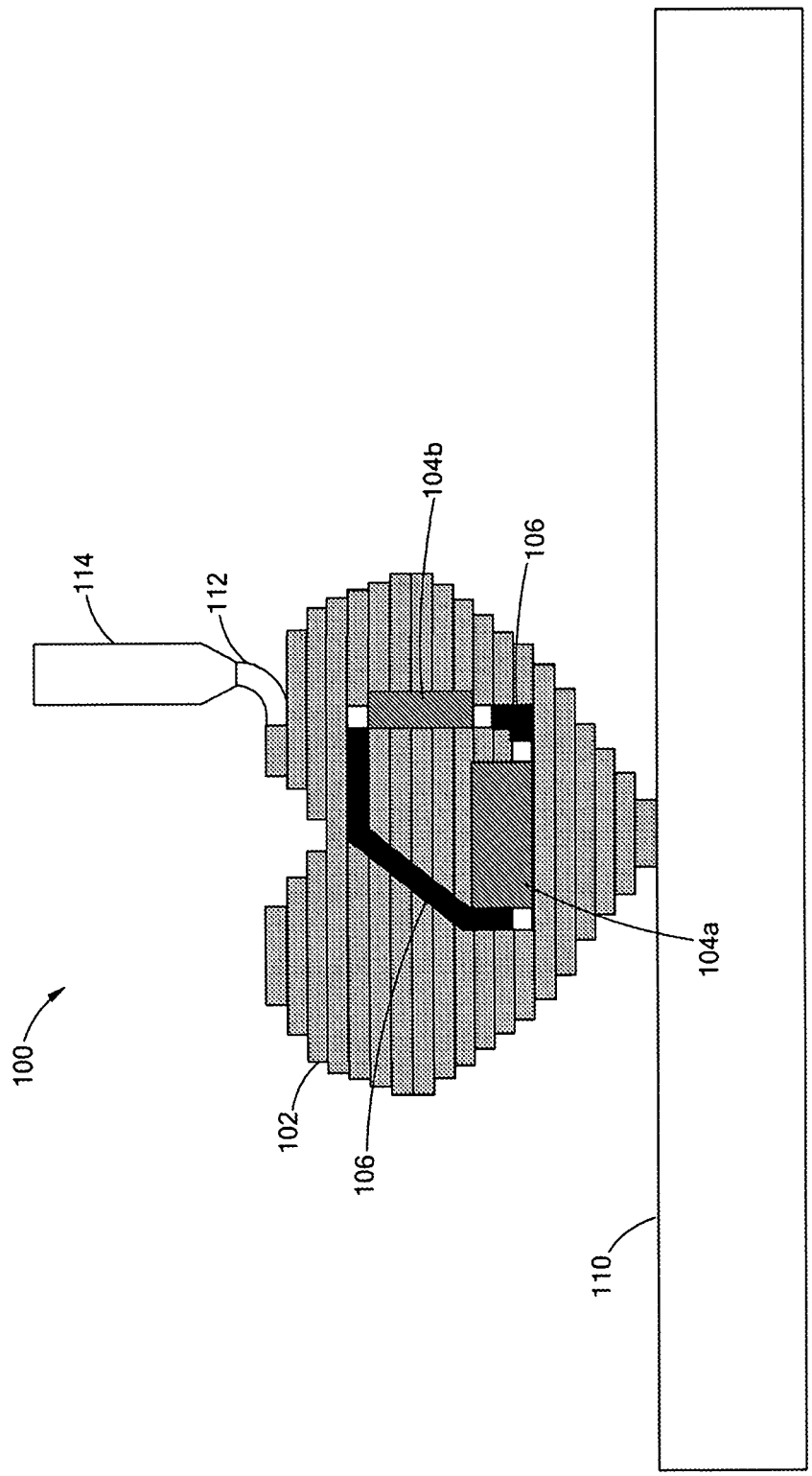

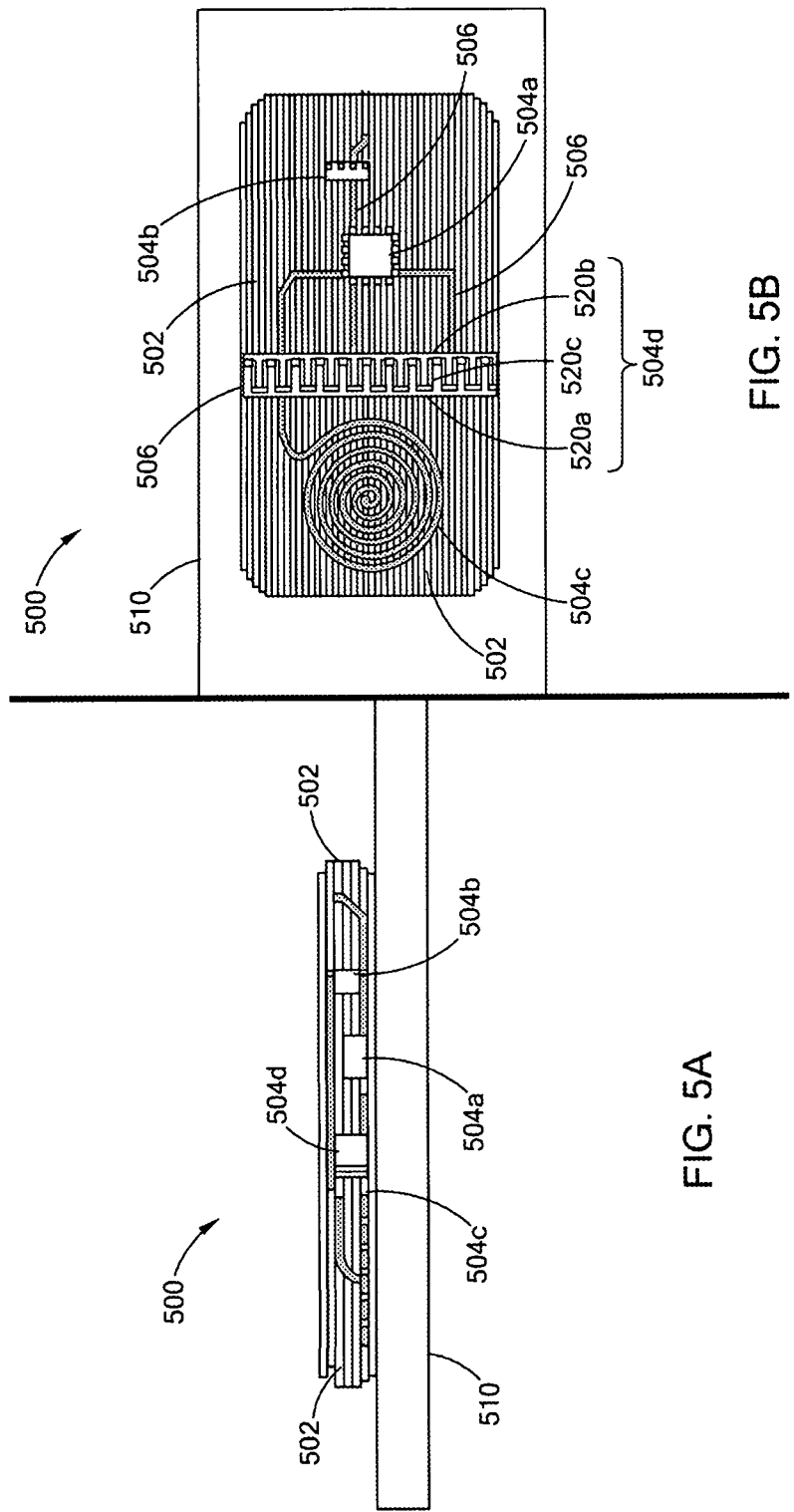

PRINTED THREE-DIMENSIONAL (3D) FUNCTIONAL PART AND METHOD OF MAKING

RELATED APPLICATIONS

The present patent document is the national stage of International Application No. PCT/US2014/043860, which was filed on Jun. 24, 2014, and which claims the benefit of the filing date under 35 U.S.C. § 119(e) of U.S. Provisional Patent Application Ser. No. 61/838,714, which was filed on Jun. 24, 2013. Both of the aforementioned applications are hereby incorporated by reference in their entirety.

TECHNICAL FIELD

The present disclosure is related generally to three-dimensional (3D) printing technology and more particular to direct-write fabrication of 3D functional parts.

BACKGROUND

Electronics manufacturing has been moving overseas at a rapid pace. It is increasingly difficult to produce popular commercial devices, such as cell phones, in the U.S. because engineers are designing them with hundreds of parts that can be made and assembled for pennies overseas. Not only is the cost of labor a driving factor in outsourcing manufacturing, but also lax environmental regulations abroad, which offer a competitive advantage that the U.S. cannot match. For example, printed circuit boards (PCBs) still take days or weeks to prototype and are typically made by third parties using highly expensive specialized etching/milling equipment. PCB manufacturing requires numerous chemical processes and materials, many of which contain chemicals that are difficult to dispose of and harmful to the environment.

Additive fabrication techniques, such as 3D printing, offer the potential to disrupt current manufacturing methods and bring the U.S. back to the forefront of cutting edge, environmentally benign manufacturing. Specialized machines that rely on costly tooling, dies, and so forth may no longer be needed to make individual products. The need for millions of unskilled workers to assemble devices could be eliminated, as well as a compelling value proposition to manufacture devices halfway around the globe. As the world faces shortening supplies of materials and an increase in pollution from transportation, zero-waste manufacturing may become a necessity. The Department of Energy estimates that nearly a 50% reduction in energy would be obtained by using additive, instead of subtractive, manufacturing processes.

BRIEF SUMMARY

A printed 3D functional part includes a 3D structure comprising a structural material, and at least one functional electronic device that is at least partially embedded in the 3D structure. The functional electronic device has a base secured against an interior surface of the 3D structure. One or more conductive filaments are at least partially embedded in the 3D structure and electrically connected to the at least one functional electronic device.

A method of printing a 3D functional part comprises, according to one embodiment: extruding and depositing a structural filament in a predetermined pattern on a substrate to form one or more portions of a 3D structure; placing or forming at least one functional electronic device on an exposed surface of the one or more portions; and extruding and depositing one or more conductive filaments to form interconnections with the at least one functional electronic device. The method may in some embodiments further comprise extruding and depositing an additional length of the structural filament in a predetermined pattern on the substrate to form one or more additional portions of the 3D structure. The one or more additional portions may at least partly cover the at least one functional electronic device.

A method of printing a 3D functional part comprises, according to another embodiment, extruding and depositing a structural filament in a predetermined pattern on a substrate to form one or more portions of a 3D structure, which has a predetermined volume. At least one functional electronic device is placed or formed on an exposed surface of the one or more portions, and a battery is formed on another exposed surface of the one or more portions. The battery has dimensions customized to the predetermined volume. One or more conductive filaments are extruded and deposited to form interconnections with the at least one functional electronic device and the battery.

A method of printing a 3D functional part comprises, according to another embodiment: forming one or more portions of a 3D structure using a 3D printing method; positioning at least one functional electronic device on an exposed surface of the one or more portions; and forming conductive interconnects to and from the at least one functional electronic device using a 3D printing method. The method may further comprise, in some embodiments, forming one or more additional portions of the 3D structure using a 3D printing method. The one or more additional portions of the 3D structure may at least partially cover the at least one functional electronic device.

A 3D printer comprises two or more computer-controlled modular printheads removeably mounted adjacent to each other. Each printhead includes at least one nozzle for extruding and depositing structural and/or functional filaments.

BRIEF DESCRIPTION OF THE DRAWINGS

FIGS. 2A-2G show exemplary steps in a direct-write process of printing a 3D structure comprising embedded electronics.

FIGS. 5A and 5B are front cross-sectional and top cross-sectional schematics of an exemplary 3D functional part produced by a combination of 3D printing and pick and place steps.

DETAILED DESCRIPTION

A novel three-dimensional (3D) printing technique based on direct-write fabrication has been developed to produce complex 3D structures comprising embedded electronics. With 3D printing, complex functional parts may be produced rapidly while reducing the material waste associated with typical subtractive methods of manufacturing.

Direct-write fabrication may entail flowing a precursor ink of a suitable chemistry and viscosity through a deposition nozzle attached to a moveable micropositioner with x-, y-, and z-direction capability. As the nozzle and/or substrate is moved, a filament comprising the precursor ink may be extruded through the nozzle and continuously deposited in a configuration that depends on the motion of the micropositioner. Accordingly, direct-write technology may be employed to build up 3D structures layer by layer. The printing process may involve more than one precursor ink and/or more than one nozzle in a serial or parallel printing process. In addition, one or more nozzles may be configured to carry out "pick and place" steps to insert non-printed functional electronic devices within the 3D structure during printing. The functional electronic devices may also be printed along with the 3D structure itself using direct-write fabrication. It is further contemplated that direct-write technology may be integrated with other 3D printing methods (e.g., inkjet printing on a powder bed, selective laser sintering of a powder bed, stereolithography, fused deposition modeling, direct inkjet printing of UV curable resins), so that different components, devices or regions of a single 3D part may be produced using different 3D printing approaches.

Figure 1:
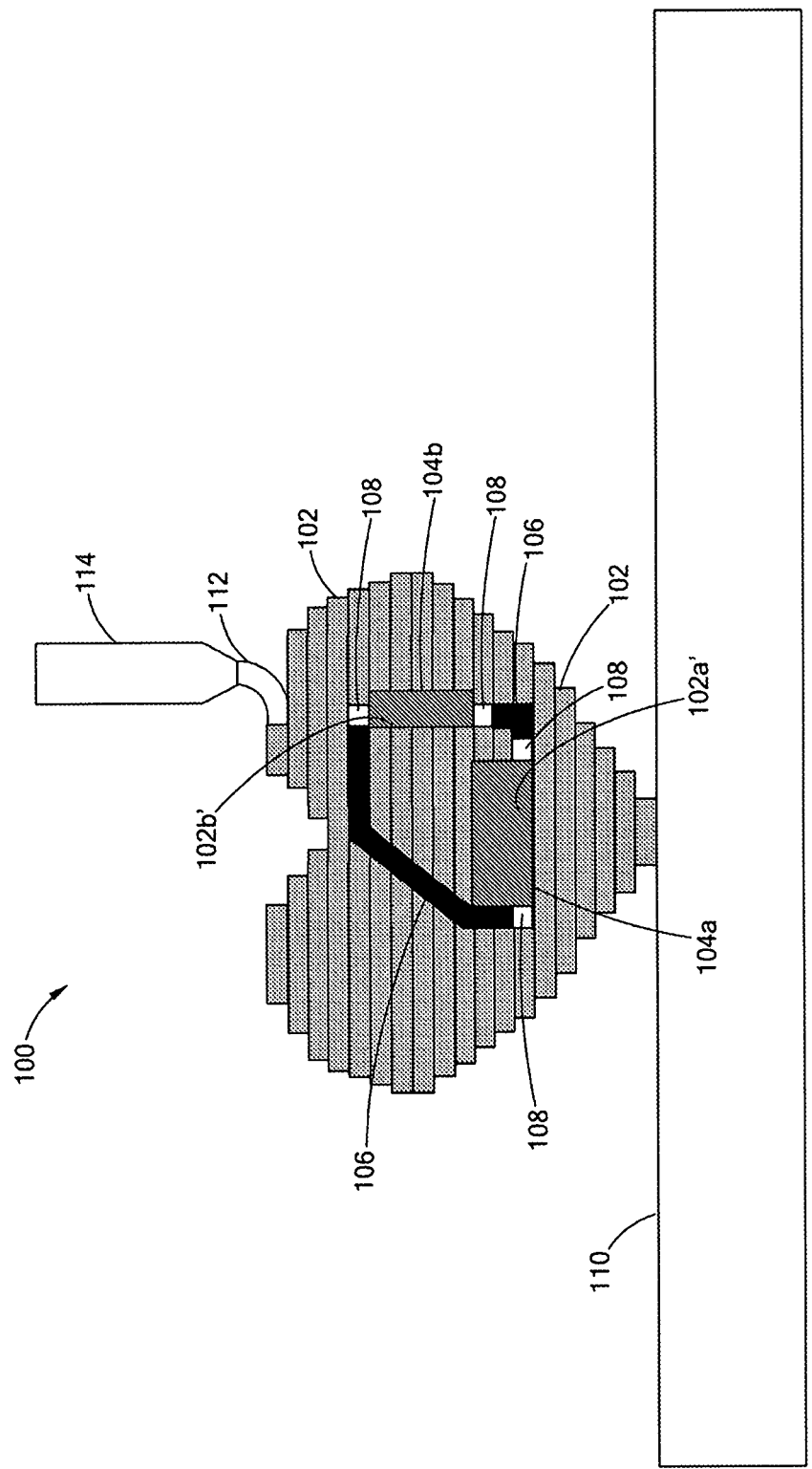
FIG. 1 is a schematic of an exemplary 3D printed structure comprising embedded electronics.

FIG. 1 shows an exemplary printed 3D functional part 100 including embedded electronics. The printed 3D part 100 includes a 3D structure 102 comprising a structural or matrix material, and at least one functional electronic device is at least partially embedded in the 3D structure 102. In the example of FIG. 1, the two functional electronic devices 104a, 104b are completely embedded in the 3D structure 102. Each functional electronic device 104a, 104b has a base secured against an interior surface 102a', 102b' of the 3D structure 102. The 3D structure 102 of this example is a heart-shaped structure, and the functional electronic devices 104a, 104b are integrated circuits (ICs). The heart-shaped structure is illustrative only and is not intended to be limiting, as other 3D structures are within the scope of this disclosure. One or more conductive filaments 106 are at least partially embedded in the 3D structure 102 and electrically connected to the functional electronic devices 104a,104b. Each of the one or more conductive filaments 106 may comprise a percolating network of conductive particles. As shown in FIG. 1, the conductive filaments are fully embedded in the 3D structure 102 and connected to IC pads 108 in electrical contact with the ICs 104a,104b. The conductive filaments 106 may comprise one or more secured portions attached to the 3D structure 102. As described below, these secured portions may be strongly bonded to the 3D structure upon drying. Advantageously, the conductive filaments 106 may have an adhesion strength sufficient to pass an adhesion test conducted according to ASTM Test Method D3359, "Standard Test Methods for Measuring Adhesion by Tape Test."

As stated above, the functional electronic device(s) and/or conductive filament(s) may be fully embedded (e.g., encapsulated) within the 3D structure. Alternatively, the functional electronic device(s) and/or conductive filament(s) may be partially embedded within the 3D structure, such that a portion of the device and/or filament may be accessed from outside the 3D structure.

The 3D structure may include a plurality of functional electronic devices embedded therein, such as at least two, at least five, at least 10, at least 20, or at least 50 functional electronic devices. The functional electronic devices may be selected from active electronic components, passive electronic components, integrated circuits, electromechanical components, such as switches and cooling fans, printed circuit boards or other electronics, and/or electrochemical components such as batteries. The 3D structure itself may have any simple or complex geometry. In one example, the printed 3D functional part is a hearing aid and the 3D structure comprises the polymeric shell or body, as described further below.

The 3D structure may include a plurality of layers. Each layer may have a thickness ranging from about 1 micron to about 10 mm, depending on the material properties and processing parameters, including nozzle inner diameter or width and printing speed. The thickness of each layer is generally at least about 2 microns, at least about 10 microns, at least about 30 microns, or at least about 50 microns. Typically, the thickness is no greater than about 1000 microns, no greater than about 500 microns, or no greater than about 100 microns. The thickness may approximately correspond to the diameter or width of a filament extruded through the nozzle during direct-write fabrication of the 3D structure, as discussed in greater detail below. Depending on how the printed 3D structure is processed (e.g., any post-printing sintering steps), as well as on the flow characteristics of the filament(s) from which the 3D structure is formed, a layered structure may be readily discernible (by eye or at the appropriate magnification) or partially or completely hidden by the effects of sintering and/or settling of the filaments.

The structural or matrix material of the 3D structure may be an electrically insulating material. In one embodiment, the structural material may comprise a polymer, such as a thermoplastic polymer or photocurable resin, a composite, such as glass-fiber filled epoxy, or a ceramic. For example, the polymer may be selected from the group consisting of acrylonitrile butadiene styrene (ABS), polylactic acid (PLA), poly(methyl methacrylate) (PMMA), epoxy, polydimethylsiloxane (PDMS), polyamide (Nylon), polyimide (PI), polyethylene (PE), polypropylene (PP), polystyrene (PS), polytetrafluorethylene (PTFE), polyvinylchloride (PVC), polyurethane (PU), polycarbonate (PC), photocurable resins, epoxies, and hydrogels. The ceramic may be selected from the group consisting of oxides, carbides, borides, nitrides, and silicides. For example, suitable ceramics may include alumina, beryllia, ceria, silica, titania, zirconia, silicon carbide, silicon nitride, boron nitride, clay, and hydroxyapatite. The structural material of the 3D structure may also comprise a composite material. For example, filler particles comprising a ceramic or glass may be incorporated into a polymeric matrix.

Due to the positioning flexibility inherent to direct-write printing, where the deposition nozzle may translate along and rotate about each of the x-, y- and z-axes, the functional electronic devices may be oriented at any angle within the 3D structure. For example, when the 3D structure includes a plurality of functional electronic devices embedded therein, the base of at least one of the functional electronic devices may be oriented at a non-zero angle with respect to the bases of the other functional electronic devices. Referring to FIG. 1, for example, the IC 104b on the right has a base rotated at an angle of 90 degrees with respect to the base of the IC 104a on the left. This flexible positioning capability may provide advantages in terms of the number density of devices that may be embedded in the 3D structure.

Figure 3:
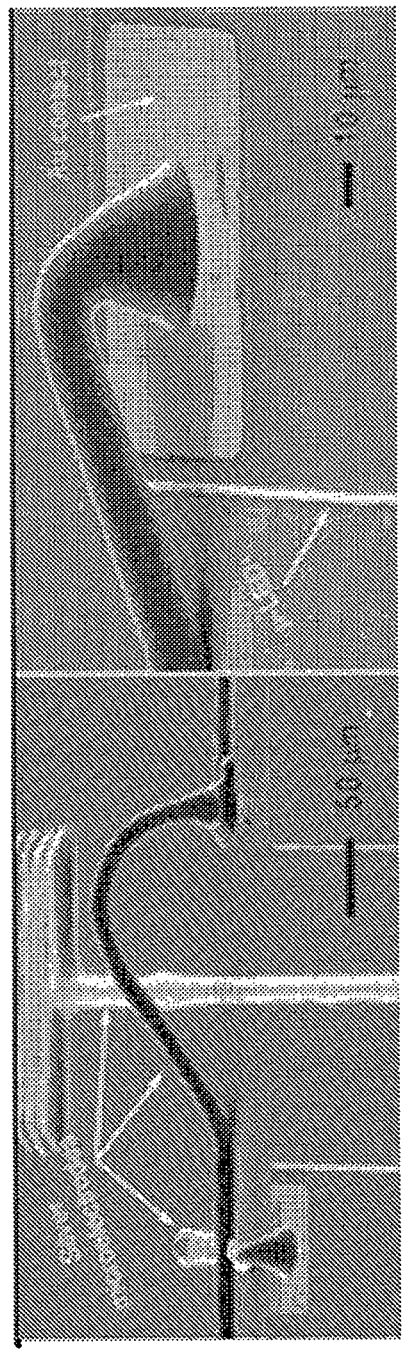
FIG. 3 is a scanning electron micrograph (SEM) of a conductive (silver) filament that is partially unsupported along its length.

Another advantage of the fabrication method is that one or more of the conductive filaments may follow a nonplanar pathway between connection points. In other words, the conductive filaments are not limited to a planar pathway, in stark contrast to the conductive traces on a printed circuit board. In addition, the conductive filament may be designed with an appropriate chemistry and viscosity to be at least partially self-supporting after extrusion. Accordingly, one or more of the conductive filaments may be unsupported along a portion of its length by the substrate or an underlying layer of the structural material, as shown, for example, by the images of a conductive (silver) filament in FIGS. 3 and 12D. A large number of conductive filaments may be printed in a complex configuration within the 3D structure, forming, for example, a spaghetti-like arrangement.

The conductive filament may comprise an electrically conductive material, such as a transition metal, an alkali metal, an alkaline earth metal, a rare earth metal, or carbon, which may also function as a heat conductor. For example, the conductive material may be selected from the group consisting of: silver, copper, lead, tin, lithium, cobalt, gold, platinum, palladium, titanium, molybdenum, tungsten, tantalum, rhenium, zirconium, vanadium, chromium, niobium, iron, nickel, zinc, aluminum, magnesium, and carbon (e.g., graphite, graphene, carbon nanotubes, carbon black). In addition to serving as conductive traces for the functional electronic devices, some or all of the conductive filaments may also or alternatively function as heat sinks and/or heating elements in the 3D functional part. For example, conductive filaments may be distributed uniformly or non-uniformly throughout a 3D part and used as heating elements to drive thermal curing of the structural material. In another example, some or all of the conductive filaments may be used to dissipate heat generated by the functional electronic devices during use.

The conductive filament may be formed from a precursor ink formulation comprising conductive nanoparticles and/or having a reactive chemistry. Such precursor inks are described for example in U.S. Pat. No. 7,922,939 entitled "Metal Nanoparticle Inks," and in "Reactive Silver Inks for Patterning High-Conductivity Features at Mild Temperatures," by S. B. Walker and J. A. Lewis, *Journal of the American Chemical Society*, 134 [3] 1419-21 (2012), both of which are hereby incorporated by reference. Alternatively, the conductive filament may be extruded from a conductive ink formulation comprising conductive particles dispersed in a solvent. The conductive particles may comprise conductive flakes, such as silver flakes, in one example. Alternatively, the conductive particles may have another morphology, such as rods, spheres, polygons, tubes, needles, etc. Exemplary conductive particles include: silver polygons and nanorods, gold nanorods, silver-coated copper particles, silver-coated copper flakes, silver-coated copper rods, tin particles, nickel particles, aluminum particles, insulating particles coated with conductive coatings, graphene, graphite, carbon black, carbon nanotubes, conductive polymer particles, and pure copper particles that may be packaged with an appropriate reducing agent to prevent surface oxidation.

The solvent for the conductive ink formulation may be selected to promote formation of a strong bond between the conductive filament and the underlying substrate—which may be the structural material of the 3D structure—upon drying. Preferably, the solvent is capable of dissolving a surface layer of the structural material, so that portions of the conductive filament that come into contact with the 3D structure may strongly adhere upon drying. The solvent employed for the conductive ink formulation may be selected based on a comparison of the Hansen solubility parameters of a given solvent with the volume of a solubility sphere associated with the substrate material (e.g., a thermoplastic polymer), as set forth for example in J. Burke, "Solubility Parameters: Theory and Application," *The Book and Paper Group Annual*, 3 (1984), available at: http://cool.conservation-us.org/coolaic/sg/bpg/annual/v03/bp03-04.html. Liquids having solubility parameters that lie within the volume of the solubility sphere for a given substrate material may be considered to be active solvents for that material. The volume of the solubility sphere for a given material is defined by the Hansen solubility parameters ($\partial_d$, $\partial_p$, $\partial_n$) and a radius of interaction (R), which denote the center of the sphere and its extent, respectively. Solubility parameters for various solvents and polymers may be found in C. M. Hansen, *Hansen Solubility Parameters: A User's Handbook*, published by CRC Press (2000), and *Polylactic Acid: PLA Biopolymer Technology and Applications*, published by William Andrew (2012) (for PLA solubility parameters in particular). In the context of 3D printing, solvents for conductive inks that have Hansen solubility parameters lying within the solubility sphere of a given structural material may be expected to be chemically compatible with and miscible with the structural material. More specifically, the solvent is expected to be sufficiently miscible with the structural material such that, at areas of contact between the conductive filament and the structural material, a strong bond may form upon drying. Preferably, the solvent is a volatile solvent that readily evaporates to facilitate drying of the conductive filament at room temperature.

Suitable solvents may include organic esters, such as ethyl acetate, butyl acetate, propyl acetate, pentyl acetate, and/or hexyl acetate. Such solvents may exhibit low toxicity, tunable hydrophobicity and a desirable vapor pressure. Additionally, these solvents may be miscible with both polar and nonpolar materials and may exhibit good wettability on thermoplastic polymers.

Alcohols of varying length, such as methanol, ethanol, propanol, butanol, pentanol, hexanol, heptanol, and/or octanol, and carboxylic acids of varying length, such as formic acid, acetic acid, and propionic acid, may also be used as solvents. In some embodiments, polar solvents such as water, ethylene glycol, glycerol, and/or n-methyl-pyrrolidone, or intermediate polarity solvents such as tetrahydrofuran or 2-methyl tetrahydrofuran may be employed. Other suitable solvents may include ethylene glycol butyl ether, ethylene glycol butyl ether acetate, propylene glycol butyl ether, propylene carbonate, ethylene carbonate, cyclohexanol, heptyl acetate, octyl acetate, mineral spirits, propylene glycol methyl ether, methyl n-amyl ketone.

A capping agent such as a long chain fatty acid may be used to coat the conductive particles of the conductive ink to inhibit or prevent flocculation. For an exemplary system described below, silver flakes are produced by milling silver powder in the presence of a capping agent and a pentyl acetate solvent, and the silver flakes remain substantially dispersed throughout the milling process. The capping agent may contain a carboxylic acid group at the end of the fatty acid molecule that binds strongly to the surfaces of silver flakes while the long chain hydrocarbon protrudes into the surrounding solvent. Alternatively, the carboxylic acid group may be replaced with another functional group having a high affinity for the conductive particle surfaces, such as a thiol (e.g., dodecanethiol) and/or an amine (e.g., dodecaneamine). The capping agent may be hydrophilic to optimize dispersion of conductive particles in water or other polar solvents, such as alcohols. For example, the capping agent may include a water soluble polymer such as polyacrylic acid (PAA), polyvinylpyrrolidone (PVP), polyvinyl alcohol (PVA) or polyethylenimine (PEI) or any other polyelectrolyte.

The conductive ink may also or alternatively include a viscosifying agent to impart the desired level of viscosity to the conductive ink and also to improve the structural integrity of the printed and dried filaments. The viscosifying agent may comprise a polymer with a chain length that exceeds 10K units. For optimal conductivity in the printed and dried state, without sacrificing the structural integrity of the printed filaments, typical polymer concentrations in the ink may be between 0.1 wt. % and 5 wt. % with respect to the weight of the conductive particles in the ink. Exemplary viscosifiers include nitrocellulose (e.g., less than 12.8% nitrate substitution), cellulose esters of varying length, hydroxypropyl cellulose, hydroxyethyl cellulose, carboxymethyl cellulose, hydroxypropyl methyl cellulose, and carboxymethyl cellulose. Cellulose derivatives in general are particularly suitable as viscosifying agents because of their versatility of functional group substitution, natural abundance, and biocompatibility. The type of cellulose derivative may be chosen based in view of the desired solvent. Other types of suitable viscosifying agents may include long chain PEO, PEI, PVP, PAA, polypropylene, polyethylene glycol, polyisoprene, silicones, natural rubbers, polysaccharides (such as Xanthum gum), etc. The viscosifying agent may also or alternatively comprise a polymer latex that undergoes film formation as the solvent evaporates.

In some cases, the viscosifying agent may be dissolved in a mixture of the desired solvent and another high vapor pressure solvent used to ensure complete dissolution of the viscosifier. The latter solvent may then be evaporated from the ink prior to use. The viscosifying agent may also be designed such that a reaction occurs after deposition that changes the rheological properties of the ink. For example, a vulcanizing silicone could be used as the viscosifying agent. Prior to deposition, the viscosifier may be in the form of a polymer chain of medium length, and then, after deposition, a vulcanization reaction initiated by heat, moisture, oxygen, or UV light may induce a change to a robust solid.

In some cases, it may be advantageous to add trace amounts of other additives to the conductive ink formulation, such as carbon fibers, nanofibrilated cellulose, silicon carbide rods, carbon nanotubes, metallic rods, or other anisotropic particles that may undergo shear alignment during extrusion-based 3D printing. It may also be beneficial to include plasticizers (e.g., acetyl tributyl citrate) and/or flame retardants in the ink, depending on the ink composition, and the same additive may serve both purposes. Surface tension modifiers may also or alternatively be added to modify the wetting behavior of the ink on the desired substrate (e.g., a thermoplastic polymer). Starches may be added to help mitigate shrinkage of the conductive filament upon drying.

Generally speaking, the conductive filament may include from about 70 wt. % to about 99.9 wt. % conductive particles (post-solvent evaporation), and the range is preferably from about 90 wt. % to about 99.9 wt. %. The viscosifier is typically present in an amount of from about 0.1 wt. % to about 5 wt. % with respect to the weight of the conductive particles, and the amount is preferably from about 0.5 wt. % to about 2.5 wt. %. Other rheological and/or mechanical property modifier(s), such as carbon nanotubes, may be present in at a concentration of from about 0.01 wt. % to about 10 wt. % with respect to the weight of the conductive particles, and the concentration is preferably from about 0.1 wt. % to about 1 wt. %. In the initial ink formulation, prior to extrusion and drying to form the conductive filament, the solvent may be present at a concentration of from about 1 wt. % to about 70 wt. %, with the preferred concentration being from about 12 wt. % to about 25 wt. %

To function effectively for 3D printing, the conductive ink is preferably viscoelastic with a non-linear shear dependence; that is, the conductive ink may be able to flow through a deposition nozzle during 3D printing and yet be able to retain its filamentary shape after exiting the print head. (The inks used for printing structural and/or device filaments, as described further below, may also be viscoelastic with a non-linear shear dependence.) As indicated above, chemical compatibility and good wetting between the conductive ink and the structural material of the 3D structure are also strongly preferred. Accordingly, the conductive filament may form a strong interface with the structural material in the as-printed state as well as after any post-processing, such as annealing, without compromising the structural integrity of the 3D structure. Because of the desired electronic functionality of the 3D printed parts, it is preferred that the conductive filament exhibits a sufficiently high conductivity. For example, the conductivity of the conductive filament may be at least about 1%, at least about 2.5%, at least about 5%, or at least about 10% of the conductivity of the bulk metal after drying at room temperature. Advantageously, the conductivity is at least about 20%, at least about 30%, at least about 40%, at least about 50%, or at least about 60% of the bulk metal conductivity, and may be as high as about 70%, 80%, 90% or 99% of the bulk metal conductivity.

Each conductive, structural or device filament, which may be referred to as an extruded filament, may comprise a diameter (or width) of from about 1 micron to about 1 mm, or from about 50 microns to about 500 microns. For example, the diameter or width of the extruded filament(s) may be about 1 mm or less, about 500 microns or less, about 300 microns or less, about 200 microns or less, about 100 microns or less, about 50 microns or less, or about 30 microns or less. Typically, the diameter of the conductive filament is at least about 1 micron, at least about 5 microns, or at least about 10 microns.

Depending at least in part on the shape of the extrusion nozzle, the extruded filaments may in some embodiments have a substantially cylindrical shape. Because the printed (e.g., extruded and deposited) filaments may undergo a settling process or, in some cases, a sintering process after being deposited in one or more layers on the substrate, the transverse cross-sectional shape of the printed filaments may include some distortions from a perfect circle. The printed filaments may therefore be described as having a substantially cylindrical shape or a distorted cylindrical shape. In either case, the transverse cross-sectional shape of the printed filament is a curved shape without corners. Alternatively, the filaments may be printed from a nozzle that does not have a circular cross-section; for example, the transverse cross-section of the nozzle may be rectangular, square, pentagonal, hexagonal, or another polygonal shape. In such embodiments, the extruded filament may have a polygonal transverse cross-sectional shape (which may have rounded corners) that depends on the shape of the nozzle. The preceding description applies to the extruded filaments comprising a conductive material as well as to the filaments comprising a structural material or another material (e.g., a functional material).

FIGS. 2A-2G schematically show steps in printing an exemplary 3D structure including one or more functional electronic devices.

Referring to FIG. 2A, the 3D printing method entails forming, in a predetermined pattern on a substrate (or build platform) 110, one or more portions of a 3D structure 102, which in this example is a bottom portion 102a of the heart-shaped structure shown in FIG. 1. The bottom portion 102a includes one or more exposed surfaces 102a', such as a channel or cavity, as shown in FIG. 2A, for incorporation of a functional electronic device or a conductive filament in a subsequent or concurrent processing step. For example, the structural filament 112 may be extruded out of a first nozzle 114 and one or more conductive filaments may be extruded out of a second nozzle while the structural filament is being extruded and deposited. In other words, the conductive filaments and the structural filament may be co-printed. Alternatively, the conductive filament(s) may be extruded and deposited after one or more portions of the 3D structure are formed. By the completion of the printing process, the exposed surface(s) may become interior surface(s) of the 3D structure 102, as shown in FIG. 1, depending on whether the functional electronic devices and the conductive filaments are partially or fully embedded therein.

As shown, the formation of the first portion 102a may entail extruding a filament 112 comprising a structural material out of a nozzle 114 and depositing the filament 112 on the substrate 110 (either directly onto the substrate or onto a layer previously deposited on the substrate) while the nozzle is moving along a predetermined pathway. The predetermined pathway may be defined with respect to the substrate 110 using an x, y, z coordinate system. The extruded filament 112 may comprise a precursor ink formulation that is forced through the nozzle 114 under a suitable applied pressure.

According to one embodiment, a single continuous filament may be extruded and deposited to form the one or more portions of the 3D structure. Alternatively, multiple discrete filaments comprising the same or different materials may be printed by starting and stopping the flow of the precursor ink formulation during the motion of the nozzle along the predetermined path. If they are placed end-to-end, multiple discrete filaments may be deposited to form what is effectively a single continuous filament on the substrate. As described above, the printing may proceed in a layer-by-layer fashion, where, after printing a first layer having the desired pattern, the nozzle may then be raised incrementally in a direction away from the substrate (e.g., the z direction) so that deposition of the filament may continue on the first layer, thus forming an additional layer of the 3D structure. The printing may also proceed in a more complex, omnidirectional fashion. In such a case, a deposited filament may be only partially supported by an underlying layer or substrate. It is also contemplated that another 3D printing method, besides direct-write fabrication, may be employed to form part or all of the 3D structure.

Figure 2B:
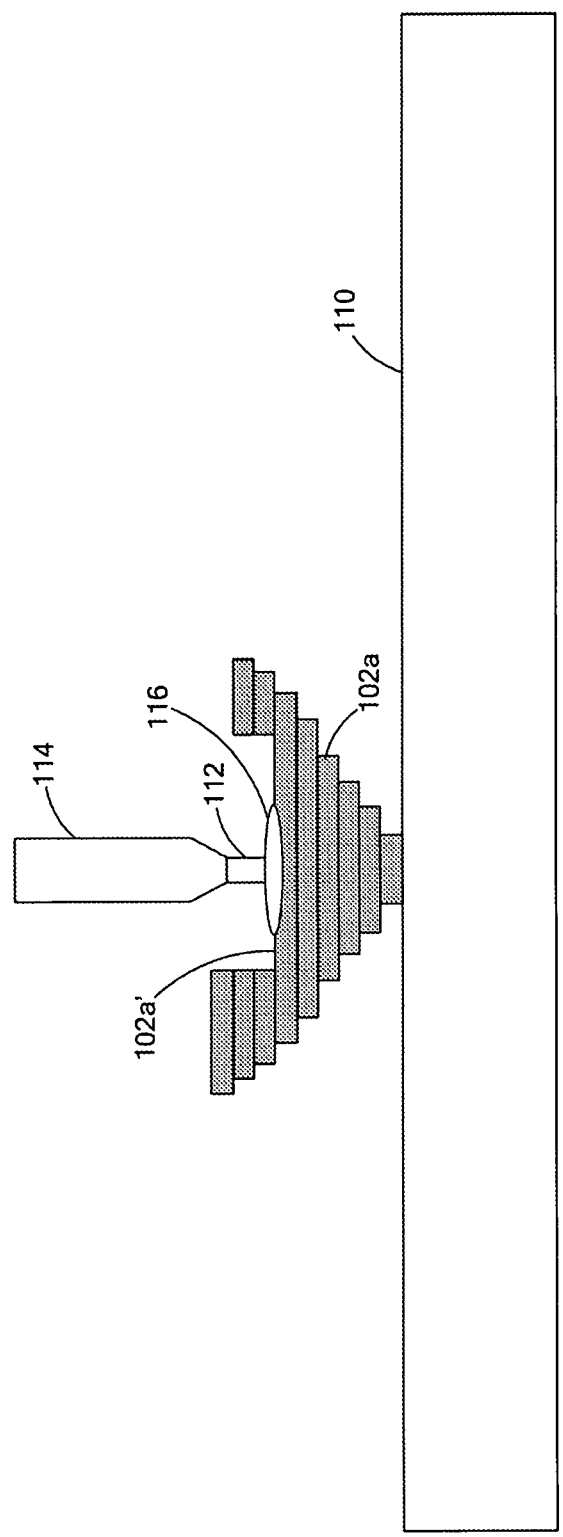

In some embodiments, as shown schematically in FIG. 2B, an adhesive 116 may be applied to the exposed surface 102a' prior to placement of the functional electronic device 104a in order to secure the device (e.g., the base of the device) to the surface 102a'. Alternatively, the structural material that comprises the exposed surface 102a' itself may function as an adhesive depending on its properties (e.g., flow properties as a function of temperature). In other embodiments, the base of the functional electronic device may not be attached to the exposed surface at this step in the process, but it may be secured against the exposed surface once the remaining portion(s) of the 3D structure is/are printed around the device, as shown for example in FIG. 1. Upon completion of the printing process, the functional electronic device(s) may be immobilized within the 3D structure.

Figure 2C:
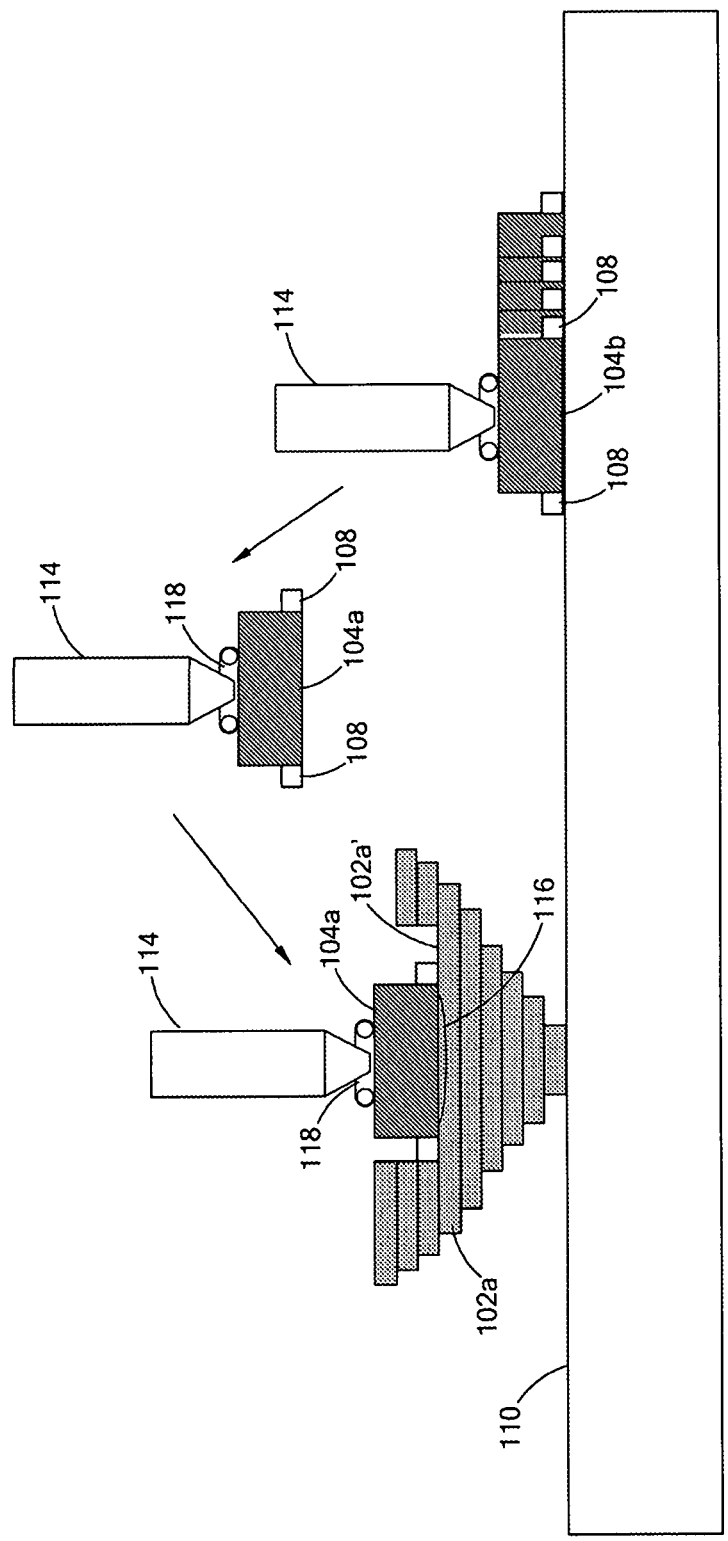

Referring to FIG. 2C, a functional electronic device 104a may be placed on the exposed surface 102a'. This may be carried out using a nozzle 114 configured for a pick and place maneuver in which the nozzle 114 is moved from a position adjacent to the first portion 102a of the 3D structure 102 to another location to pick up the device 104a and then returned to the position adjacent to the first portion 102a to deposit the device 104a on the exposed surface 102a'. (It should be noted that references to "a nozzle" or "the nozzle" in the present disclosure should not be construed as a limitation to a single nozzle during fabrication of the 3D printed functional part, as one nozzle or multiple nozzles may be used to extrude the structural, conductive and/or device filaments and/or carry out pick and place maneuvers.) Prior to the pick and place maneuver, the nozzle 114 may be emptied of the precursor ink (or a different nozzle may be employed), and a vacuum may be generated within the nozzle 114 to pick up the device. The nozzle may further be fitted with a pneumatic suction cup 118 to facilitate attachment of the functional electronic device 104a to the tip of the nozzle 114. In the example shown in FIG. 2C, an integrated circuit 104a stored in a tape reel is picked up by the nozzle 114 and deposited on the exposed surface 102a', which, in this example, includes an adhesive 116.

As described above, the functional electronic device may be an active or passive electronic component (e.g., resistor, capacitor, etc.), an integrated circuit, a printed circuit board (PCB) or another electronic device, such as a sensor, a resonator, an electromechanical component (e.g., motor, switch, fan, etc.) or an electrochemical component (e.g., battery).

As an alternative to picking and placing a prefabricated electronic device, it is contemplated that one or more of the functional electronic devices embedded in the 3D structure may be formed by a 3D printing method known in the art and/or described herein. 3D printed batteries have already been demonstrated, as described for example in "3D Printing of Interdigitated Li-Ion Microbattery Architectures," by K. Sun, T-S. Wei, B. Y. Ahn, J. Y. Seo, S. J. Dillon, and J. A. Lewis, *Advanced Materials*, published online on Jun. 17, 2013 (DOI: 10.1002/adma.201301036), which is hereby incorporated by reference.

The one or more functional electronic devices may be formed by extruding at least one device filament out of a nozzle and depositing the device filament in a predetermined pattern on the substrate. The device filament(s) may comprise a functional material that depends on the device being printed. For example, in the case of a battery, the device filaments may include a cathode filament comprising a first electrochemically active material and an anode filament comprising a second electrochemically active material, as described in more detail below. In another example, in the case of a strain sensor, the device filament may comprise an electrically conductive material, such as a silver-doped silicone composite as described in the example below. In another example, in the case of an antenna, the device filament may comprise an electrically conductive material. In this particular case and in other device embodiments, the electrically conductive material may be the same electrically conductive material that forms the conductive filaments, which function as the interconnects or conductive traces in the 3D printed functional part. In such a case, the device filament and the conductive filaments may be formed from a single continuous extruded filament comprising the same electrically conductive material. In other embodiments, the functional electronic device(s) and the conductive filament(s) may be formed from different ink formulations and, consequently, from different extruded filaments.

An exemplary 3D functional part 500 including functional electronic devices produced using a combination of pick and place maneuvers and 3D printing (e.g., direct-write fabrication) is shown schematically in FIGS. 5A and 5B, which show a front cross-sectional view and a top cross-sectional view, respectively. The exemplary 3D functional part 500 is a cell phone where selected embedded electronic devices and conductive interconnects are shown. In this example, integrated circuits 504a, 504b are incorporated in the 3D structure 502 using pick and place technology, as described for example in reference to FIGS. 2C and 2F, whereas the conductive interconnects 506, spiral antenna 504c, and microbattery 504d (including anode 520a, cathode 520b and separator 520c) are directly printed on portions of the 3D structure 502 (which is also 3D printed). The printed functional electronic devices may be fabricated using direct-write technology as described herein or using another 3D printing method known in the art. Accordingly, the 3D functional part 500 may be constructed entirely by 3D printing steps, or by a combination of 3D printing steps and pick and place maneuvers.

Figure 2E:
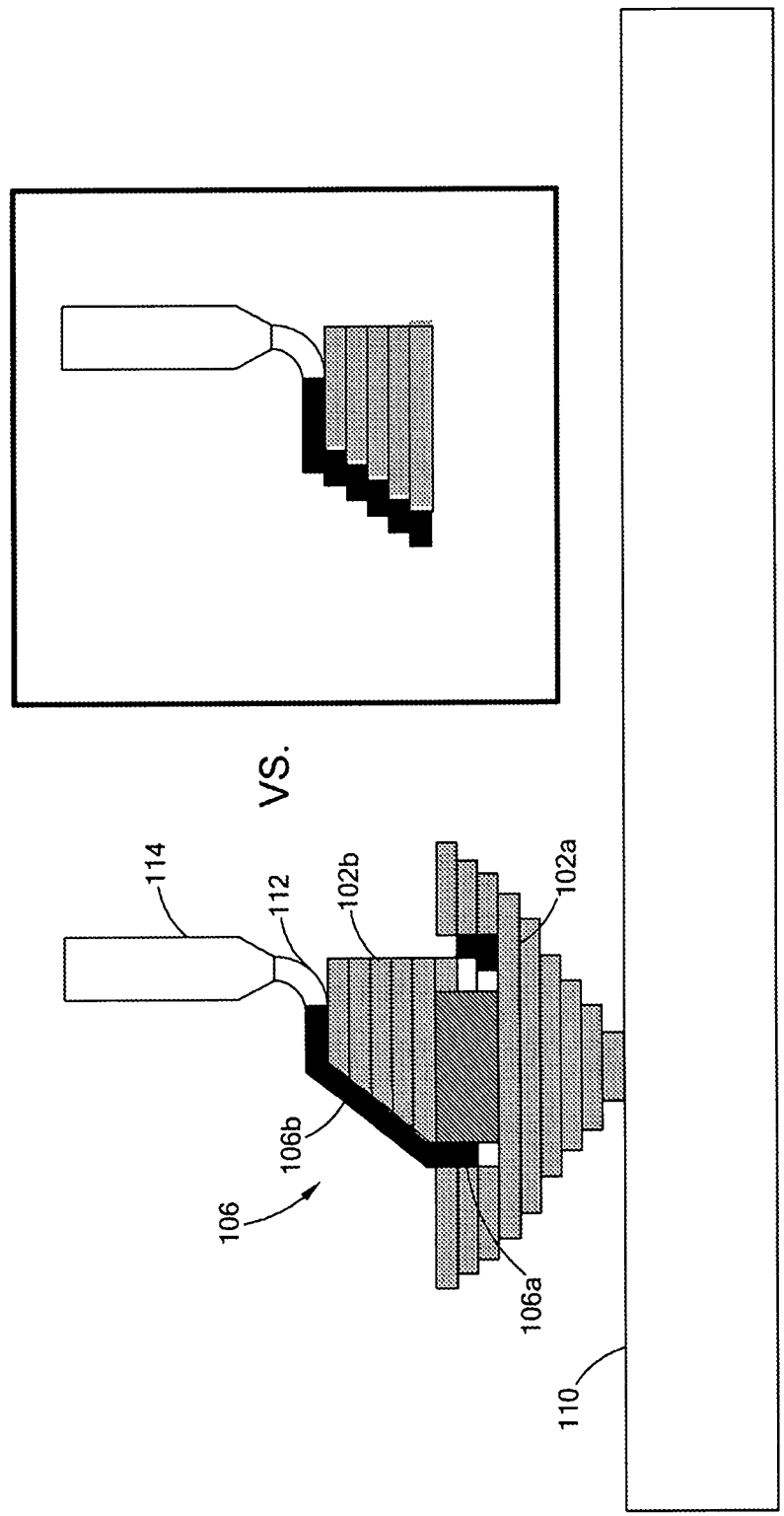

After placement (or printing) of the functional electronic device(s), interconnects may be formed to and from the device(s) by extrusion and deposition of a conductive filament comprising an electrically conductive material through the nozzle, as set forth above. The formation of the conductive filament may not take place in a single printing or deposition step. As shown in FIG. 2D, a precursor ink 112 comprising an electrically conductive material may be flowed through the nozzle 114 to extrude a first portion 106a of the conductive filament, and the extrusion process may be halted when the interconnect, which in this example is being deposited perpendicularly to the layers of the first portion of the 3D structure, reaches the current layer height. As shown in FIG. 2E, prior to forming a remaining portion 106b of the conductive filament 106, an additional portion 102b of the 3D structure 102 may be formed layer by layer over the first IC 104a. The remaining portion 106b of the conductive filament 106 may then be formed in an omnidirectional printing step, where the nozzle 114 is moved along a pathway that may have variable x, y and z components as the conductive filament 106 is extruded and deposited. Accordingly, a smooth, "step-less" filament 106 may be formed, in contrast to the stepped filament shown in the inset of FIG. 2E.

Figure 2F:
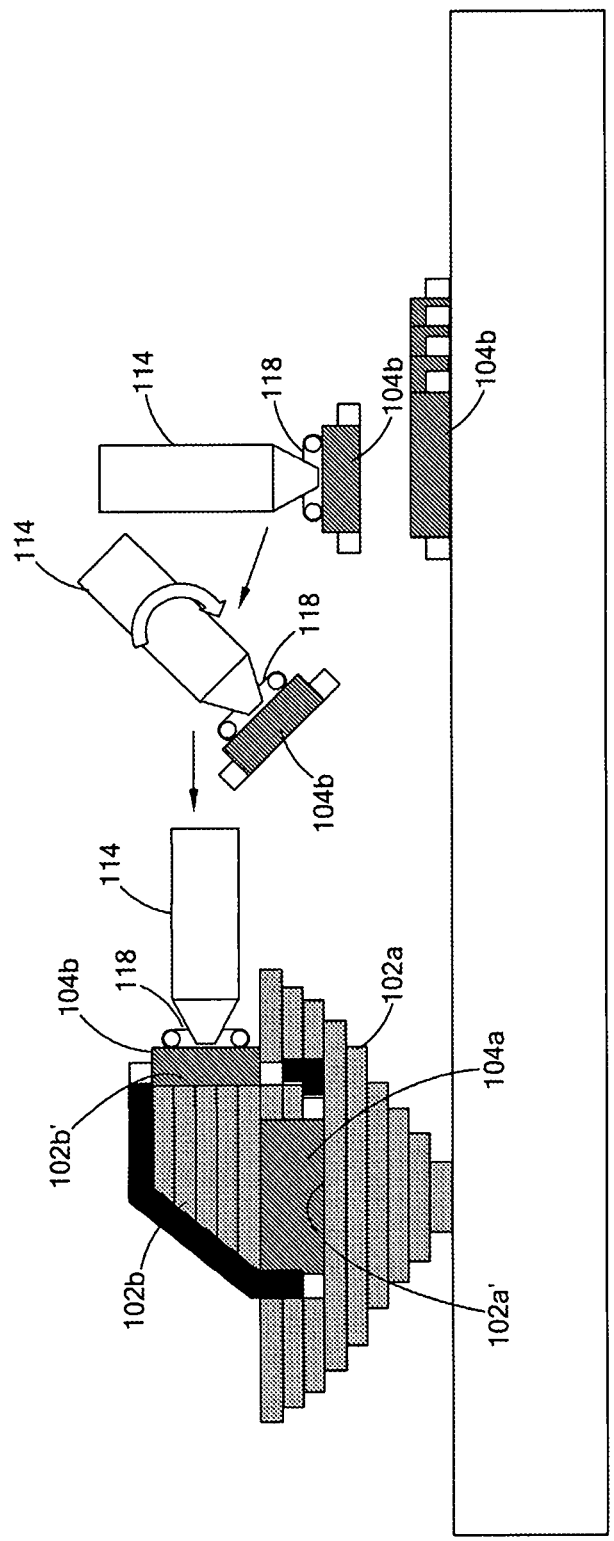

In the example of FIG. 2F, one end of the conductive filament 106 is in contact with a contact pad 108 of the first IC 104a, and the other end is positioned to contact a second IC 104b that is placed after the additional portion 102b of the 3D structure 102 is formed layer by layer. As shown, each of the functional electronic devices 104a, 104b may be positioned in any orientation with respect to the exposed surface 102a', 102b' and with respect to previously placed devices. Generally speaking, any number of functional electronic devices may be placed on and/or in contact with an exposed surface of a first or additional portion of the 3D structure. Conductive filaments may be extruded and deposited as needed for connection to the functional electronic devices. The conductive filaments may be placed on and/or in contact with one or more exposed surfaces of the 3D structure to facilitate connection with the functional electronic device(s).

Figure 10:
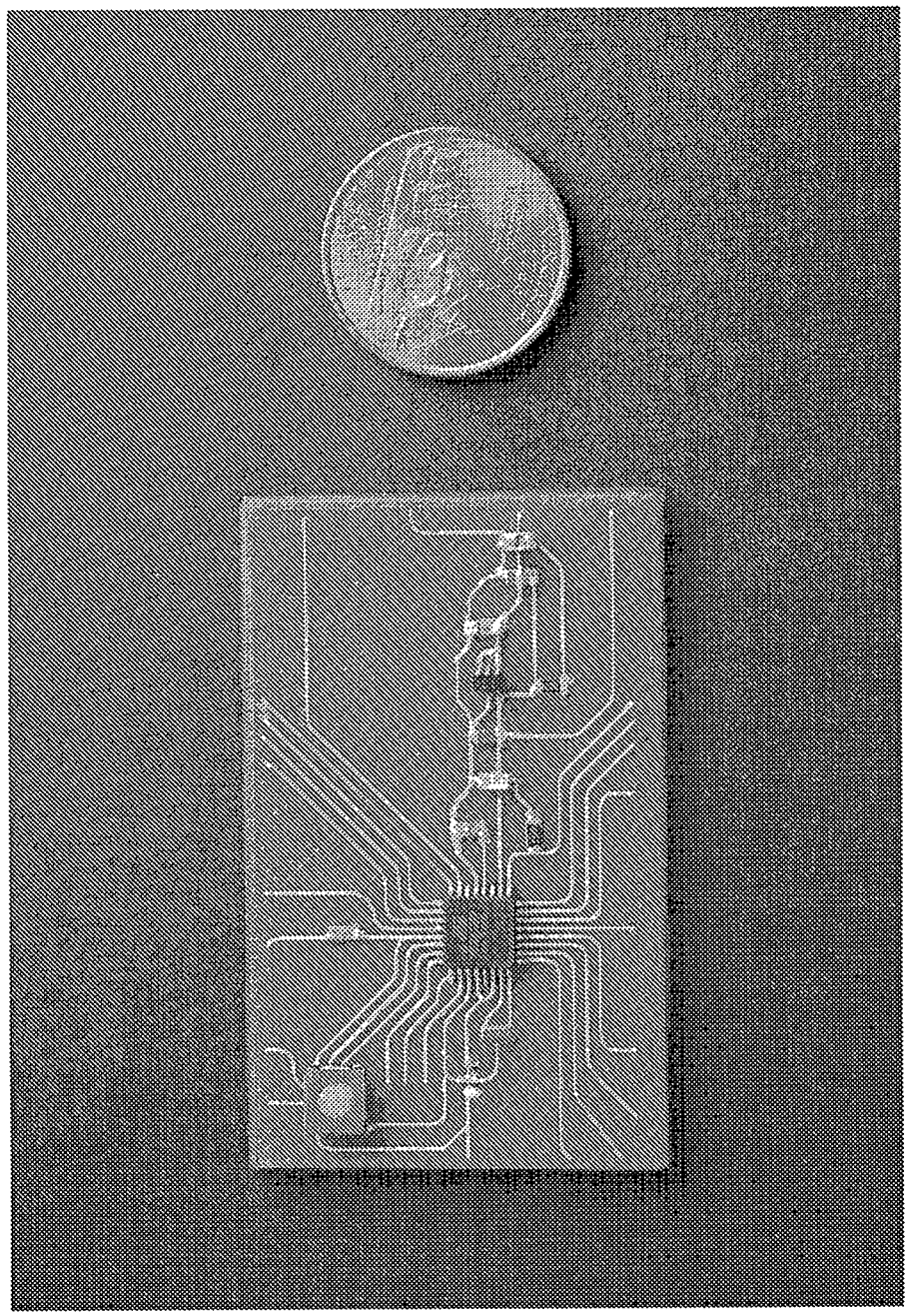
FIG. 10 is a photograph showing a top view of a 3D printed Arduino board.

The functional electronic device(s) may be designed to be partially embedded in the 3D structure, except for an exposed face of the device that includes accessible contact pads. In other words, when placed into a cavity in the 3D structure, the functional electronic device may be surrounded by 3D printed structural material on all sides, except for the exposed face. The contact pads may protrude above sidewalls of the cavity, and the functional electronic device may be flush with the surface of the 3D structure. After placement of the device into the cavity, conductive filaments may be extruded and deposited directly onto the surface of the 3D structure to make electrical connections to the contact pads on the exposed face. By designing the functional electronic device to be partially embedded with accessible contact pads as described, electrical connections may be made in a straightforward deposition process after placement of the device. The conductive filaments may connect the partially embedded functional electronic device to other devices in the 3D functional part, such as other resistors, capacitors, resonators, LEDs, batteries, microprocessors, and/or sensors, which may also be partially embedded. An example of partially embedding functional electronic devices having accessible contact pads in a 3D structure is shown in FIG. 10 and described in more detail below.

Referring to FIG. 2G, in some embodiments one or more additional portions may be printed to form the final 3D structure 102 including the embedded electronics. As above, the printing entails extruding a filament 112 comprising the structural material out of the nozzle 114 and depositing the filament layer by layer on the bottom portion (and/or on another previously deposited portion) of the 3D structure, thereby partially or completely covering any exposed functional electronic device(s) and/or conductive filament(s).

Figure 6A:
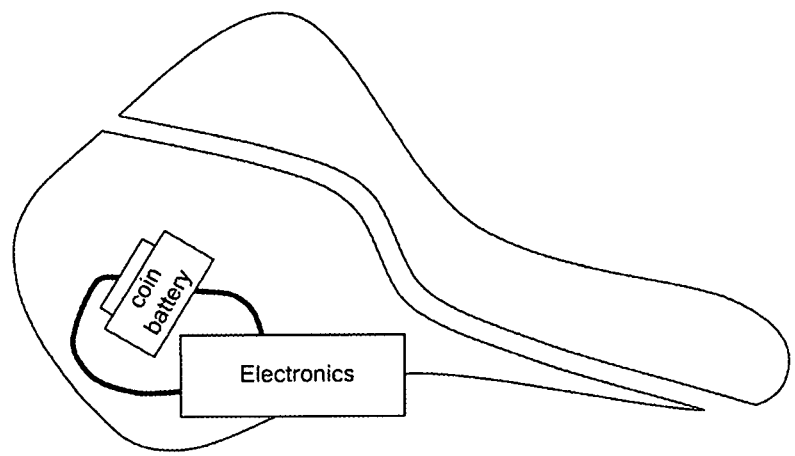
FIGS. 6A and 6B are schematics of exemplary prior art and 3D printed hearing aids, respectively.
Figure 6B:
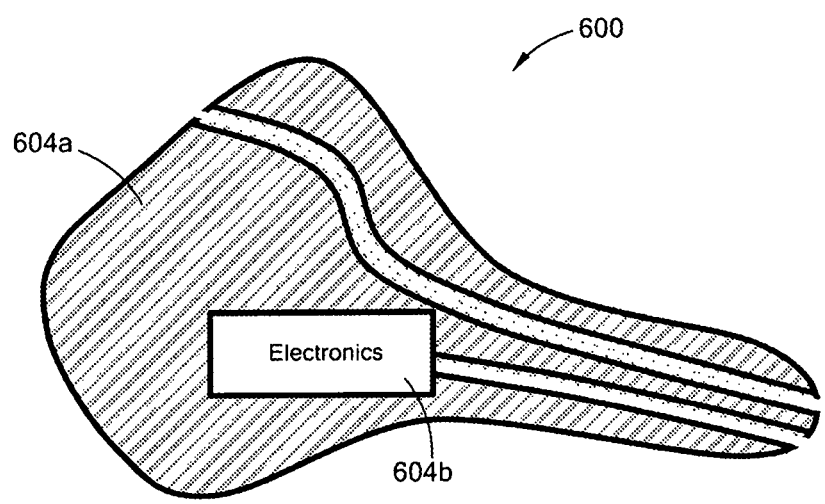

Another example of a 3D functional part including embedded functional electronic devices is shown schematically in FIG. 6B. The 3D functional part 600 shown in this example is a hearing aid and the embedded functional electronic devices include a microbattery 604a and a printed circuit board (PCB) or other electronics 604b. As in the preceding example, the hearing aid 600 may be fabricated using a combination of pick and place maneuvers and 3D printing.

To produce the hearing aid 600, a structural filament may be extruded out of a nozzle and deposited in a predetermined pattern on a substrate to form one or more portions of a 3D structure 602. In this example, the 3D structure 602 is the polymeric body or shell of the hearing aid, which has a predetermined volume that depends on the size of the intended patient's ear canal (and is known prior to fabrication). A battery 604a having dimensions customized to the predetermined volume may be formed on an exposed surface 602a of the 3D structure 602. Due to the customization, a 3D structure that has a larger predetermined volume may contain a battery having correspondingly larger dimensions, while a 3D structure that has a smaller predetermined volume may contain a battery having correspondingly smaller dimensions. A PCB or other electronics 604b may be placed or 3D printed on another exposed surface 602b of the 3D structure 602, and one or more conductive filaments may be extruded out of the nozzle to form interconnections to and from the PCB (or other electronics) 604b and the battery 604a. A structural filament is extruded out of the nozzle and deposited layer by layer on the one or more portions of the 3D structure to form one or more additional portions that partially or fully cover the battery, the PCB or other electronics, and the one or more conductive filaments. Thus, the polymeric body or shell 602 of the hearing aid 600 is formed.

One advantage of customizing the size of the battery to the predetermined volume of the hearing aid body or shell is that wasted interior space, previously occupied by a polymer filler material, can be avoided, as can be seen in reference to FIG. 6A. Instead, this space can be occupied by a larger, higher capacity battery that is custom-fabricated by 3D printing to appropriately fill the volume. Referring to FIG. 6A, the standard 312 size coin battery used in conventional hearing aids that has a capacity of about 252 mWh may be replaced by a larger, custom-fabricated battery with a capacity of about 2.7 Wh, in one example. By maximizing the size of the battery, patients with larger ear canals may benefit from longer lasting batteries, while patients with smaller ear canals may benefit from batteries that exhibit the maximum watt-hour possible. The 3D printed battery may occupy at least about 20%, at least about 30%, at least about 40%, at least about 50%, at least about 60%, at least about 70%, or at least about 80% of the predetermined volume. Typically, the battery does not occupy more than about 90% of the predetermined volume due to the presence of additional electronics and interconnects within the hearing aid body.

To form the battery, a cathode filament comprising a first electrochemically active material may be extruded out of the nozzle and deposited in a predetermined pattern on the exposed surface to form a cathode structure, and an anode filament comprising a second electrochemically active material may be extruded out of the nozzle and deposited in a predetermined pattern on the exposed surface to form an anode structure. The predetermined patterns of the cathode and anode filaments may be selected based on the predetermined volume—both the 3D size and the shape—of the hearing aid body. Accordingly, the cathode and anode structures may have any desired size and shape. In one example, the cathode structure may have a digitated structure comprising one or more cathode digits, and the anode structure may have a digitated structure comprising one or more anode digits; the cathode structure and the anode structure may further have an interdigitated relationship, where the cathode digits are positioned alternately with the anode digits, as shown schematically in FIG. 5B.

The first electrochemically active material may comprise a single or multicomponent oxide, such as (where M=metal such as Co, Ni, Fe, Mn, Ti, V, etc.): $Li_xMn_{1-y}M_yO_2$, $Li_{1-x}Mn_{2-y}M_yO_4$, $Li_{1-x}Co_{1-y}M_yO_2$, $Li_{1-x}Ni_{1-y-z}Co_yM_zO_4$, $Li_{1-x}MPO_4$, $Li_{1-x}MSiO_4$, $Li_{1-x}MBO_3$, $Li_xMn_{1-y}M_yO_2$, and/or $V_2O_5$, where x, y and z have values from 0 to 1, and the second electrochemically active material may be selected from the group consisting of (where M=metal such as Co, Ni, Fe, Mn, Ti, V, etc.): $Li_4Ti_5O_{12}$ (LTO), $TiO_2$, $SnO_2$, Sn, Si, C, $LiM_yN_2$, and/or $M_yO_x$ with M in a low oxidation state (e.g., MnO, CoO, $Fe_2O_3$, $Fe_3O_4$, CuO, NiO, ZnO), where x and y are integers.

A separator may be disposed between the cathode structure and the anode structure, and they may be contacted with an electrolyte for operation. The separator and/or the electrolyte may be formed by 3D printing (e.g., extrusion of a suitable material from a nozzle for in-situ fabrication). Alternatively, the separator and/or electrolyte may be formed or deposited by another method. The electrolyte may comprise a liquid, polymeric, or gel material, and the separator typically comprises a microporous polymer.

After printing, the 3D structure, which may be a hearing aid, cell phone housing, or any of a wide range of possible structures, may optionally be heated to a temperature sufficient to induce sintering of the structural and/or conductive materials. The selected temperature for sintering may be in the range of from about 80° C. to about 150° C. at a minimum, although the particular values depend on the materials to be sintered. Because the precursor inks may comprise particle suspensions that are optimized in terms of composition and rheology for 3D printing, the deposited filaments may have a particulate structure. The structural integrity and relative density of the deposited filaments, as well as bonding between adjacent layers of the 3D structure, may be increased by sintering (or thermal annealing).

The filaments formed from the precursor ink formulations may have a substantially cylindrical or other elongate shape as a consequence of being extruded through a nozzle during processing. Accordingly, the one or more filaments may have an average diameter or width that is the same as or similar to the inner diameter (ID) or internal width (IW) of the nozzle used for printing. For example, the average diameter (width) of the filament may be within ±20% of the nozzle ID (IW) or within about ±10% of the nozzle ID (IW). The nozzle ID (IW) may range from about 1 micron to about 10 mm in size. Typically, the nozzle ID (IW) is from about 10 microns to about 300 microns (e.g., about 100 microns) in size. As noted above, because the printed filaments may undergo a settling process or, in some cases, a sintering process after being deposited in one or more layers on the substrate, the transverse cross-sectional shape of the cylindrical filaments may include some distortions from a perfect circle while still retaining a curved shape.

Accordingly, the height of the printed 3D structure may correspond roughly to the diameter (or width W) of the one or more filaments that make up the layers, multiplied by the total number of layers. For example, the height of an exemplary 3D structure comprising embedded electronics may be from about 10 microns to hundreds of millimeters.

The 3D printer employed for extrusion and deposition may include a single printhead or multiple printheads (e.g., from two to eight printheads), where each printhead is modular and independently computer-controlled. The modular, computer-controlled printheads may be removeably mounted adjacent to each other and operated simultaneously for co-printing of different materials. The phrase "removeably mounted" means that each modular printhead can be mounted for printing and removed after printing, if desired, to allow for swapping of printheads, as described further below. Each printhead includes at least one nozzle (or multinozzle array) for extruding a structural and/or functional filament, where the term "functional filaments" refers to conductive and/or device filaments. The 3D printer may further include a build platform or substrate underlying the computer-controlled, modular printheads for deposition of extruded structural or functional filaments.

Figure 4:
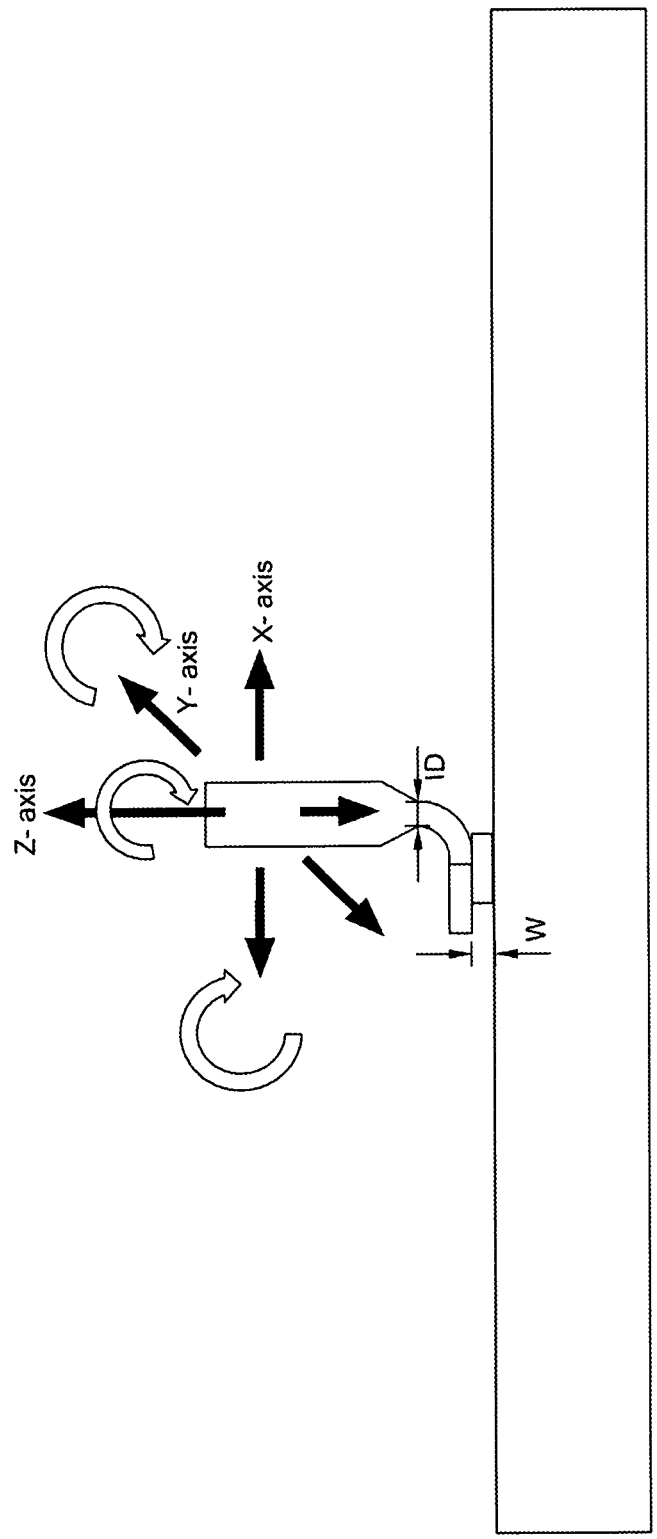
FIG. 4 is a schematic of an exemplary nozzle for direct-write fabrication.

Referring to FIG. 4, each printhead or nozzle is configured to be able to translate in the x, y and/or z directions by attachment to a standard CNC (computer numerical controlled) stage. The nozzle may also be rotated about the x- y- and/or z-axes for 6-degree of freedom movement. It is also possible for the nozzle to remain stationary during printing and for the substrate to be moved relative to the nozzle, or both the nozzle and the substrate may be moved. The nozzle may be in fluid communication with multiple ink channels that allow for printing of different inks by selection of the appropriate channel. The nozzle may also be configured so that a vacuum, instead of a positive pressure, may be applied through one of the channels to facilitate carrying out pick and place maneuvers during the printing process.

The computer-controlled modular printheads may comprise at least one room-temperature printhead configured for connection to at least one ink reservoir, as indicated above. Ink deposition from the room-temperature printhead(s) may be driven pneumatically at a constant pressure or mechanically at a constant displacement rate. The computer-controlled modular printheads may also or alternatively comprise at least one elevated-temperature printhead that includes a heater for extrusion at elevated temperatures. The elevated temperature printhead(s) may each be configured to receive a continuous feed of a monofilament of material (e.g., a thermoplastic polymer) or ink from an ink reservoir that can be extruded.

As described above, each printhead includes at least one nozzle. In general, 1 or more, 2 or more, 3 or more, 4 or more, 5 or more and up to N nozzles may be used for extruding and depositing the ink filaments, where $1 \leq N \leq 1024$, and more typically N is no more than 512, N is no more than 256, N is no more than 128, or N is no more than 64. The filaments may be extruded from the N nozzles sequentially in a serial deposition process or simultaneously in a parallel deposition process, where each nozzle may contain a different precursor ink. To facilitate sequential or serial printing from a single printhead, the nozzles may be independently controlled in the z-direction.

Viscoelastic inks to be fed to the nozzles may be housed in separate syringe barrels (or ink reservoirs) that may be individually connected to a nozzle by way of a Luer-Lok™ or other connector. The extrusion of each of the filaments may take place under an applied pressure of from about 1 psi to about 100 psi, from about 10 psi to about 80 psi, or from about 20 psi to about 60 psi. The pressure during extrusion may be constant or it may be varied. By using alternative pressure sources, pressures of higher than 100 psi and/or less than 1 psi may be applied during printing. A variable pressure may yield an extruded filament having a diameter that varies along the length of the filament. The extrusion is typically carried out at ambient or room temperature conditions (e.g., from about 18° C. to about 25° C.). For elevated temperature printing (e.g., when a fused filament fabrication (FFF) head is used for deposition), a monofilament of a suitable material, such as a thermoplastic polymer, may be fed to the elevated temperature printhead from a spool, and the extrusion may be carried out at temperatures in the range of, for example, about 100° C. to about 400° C.

During the extrusion and deposition of each filament, the nozzle (or printhead) may be moved along a predetermined path (e.g., from $(x_1, y_1, z_1)$ to $(x_2, y_2, z_2)$) with a positional accuracy of within ±100 microns, within ±50 microns, within ±10 microns, or within ±1 micron. Accordingly, the filaments may be deposited with a positional accuracy of within ±100 microns, within ±50 microns, within ±10 microns, or within ±1 micron. The nozzles may be moved and the filaments may be deposited at speeds as high as about 3 m/s (e.g., from about 1 cm/s to about 3 m/s), and are more typically in the range of from about 1 mm/s to about 500 mm/s, from about 1 mm/s to about 100 mm/s, from about 1 mm/s to about 50 mm/s, or from about 1 mm/s to about 10 mm/s.

The predetermined path of the nozzle may have an XY boundary area of at least about 2400 cm², at least about 2700 cm² and up to about 1 m² as determined by the size of the build platform of the printer. For example, the build platform may have a length of from about 60 cm to about 100 cm and a width of from about 40 cm to about 100 cm. Each print head may be moved in the z-direction a distance from about 10 cm to about 50 cm, or about 15 to about 30 cm.

Commercially available computer aided design software such as SolidWorks (Dassault Systèmes SolidWorks Corp., Waltham, Mass.) or AutoCAD (Autodesk, Inc., San Rafael, Calif.) may be used to produce a digital 3D model of the desired printed structure. These software packages are capable of exporting the 3D models as .STL files. Once in .STL format, the digital 3D model can be converted into printing instructions (G-code) for a 3D printer using "slicing software," such as Slic3r or Cura, which cuts the digital 3D model into horizontal slices or layers and generates tool paths based on (x, y, z) coordinates to fill the slices with extruded material. Process parameters include fill density, nozzle speed, the amount of ink to be extruded, and the temperature of the nozzle. A customized 3D printer and modified RepRep device (www.reprap.org) designed at Harvard University are used to create the 3D printing examples described in the present disclosure.

Exemplary Software and 3D Printers

The exemplary demonstration parts described below are first modeled using the Solidworks program, and the data are exported as .STL files and imported into Slic3r software for creation of the print path. The integration of the print path for the conductive filaments (the conductive traces) can be done in one of two ways: The conductive traces can be modeled as a separate part from the surrounding structure in Solidworks. Then the model for the conductive traces and structure can be combined in the desired orientation in a Solidworks assembly and exported as a set of .STL files. These .STL files can then be combined in Slic3r to create a multi-material model that can be sliced into G-code. The G-code is then loaded into the printer control software for the fabrication of the part.

Alternatively, when very precise and dynamic control of print speed, location, and height is desired, the print path for the conductive traces can be written manually using Mecode, which is python-based open source software for generating G-code. In this case, individual pieces of the conductive print path may be inserted at the layer changes of the code generated by Slic3r for the structural material.

3D printing is carried out using custom-built 3D motion-controlled systems. The first system uses a high-speed, large-area, high-precision gantry stage from Aerotech (Aerotech, Inc., Pittsburgh, Pa.) with two printheads mounted side-by-side. Each printhead comprises a filament extruder (or nozzle). In one configuration, an elevated-temperature printhead (e.g., an FFF head) for extrusion of structural filaments (e.g., thermoplastic polymers) and a room-temperature printhead for extrusion of conductive filaments are co-mounted. The room temperature printhead is controlled pneumatically using an EFD pressure box. (Nordson Corp., Westlake, Ohio). The printpath and co-printing of these and other disparate materials is computer-controlled.

The second system is an open source, desktop 3D printer (Rep Rap Prusa I3; www.reprap.org) that is modified by incorporating a room-temperature printhead for extruding conductive filaments in addition to the existing elevated temperature printhead for extruding structural filaments. This printer's control hardware is augmented with a pressure source to allow for controlled printing of the conductive filaments, and the control software is modified to drive this pressure source.

The above-described custom-built 3D printers are designed in a modular manner so that one or both of the printheads may be swapped out for different printheads. For example, the room temperature, pneumatic printhead used to print conductive inks and other viscoelastic materials under ambient conditions may be swapped out for a constant displacement driven printhead to provide precise volumetric flow of the desired ink. The elevated temperature printhead may be replaced with a second pneumatic or constant displacement printhead that may co-print another viscoelastic ink, such as epoxy resin, glass-filled epoxy resin, resistive or capacitive inks that may serve either as the structural material or co-printed functional materials in the final 3D printed electronic devices.

Exemplary 3D Printed Functional Parts with Embedded Devices

3D Printed Embedded Antenna

Figure 7A:
FIG. 7A shows a 3D rendering of an embedded antenna design.
Figure 7B:
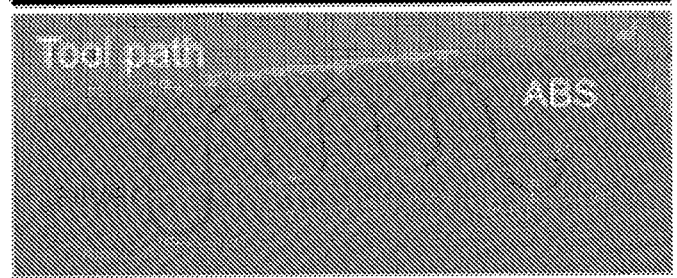
FIG. 7B shows a schematic of a multi-material tool path for co-printing a polymer matrix (structural) material and a conductive silver ink.
Figure 7C:
FIG. 7C shows a 3D printed silver antenna embedded in an ABS thermoplastic matrix.

FIGS. 7A-7C show an exemplary 3D printed embedded antenna 700, including a 3D rendering of the antenna design, a schematic of a multi-material tool path for co-depositing the structural (matrix) material and the conductive ink, and an optical image of the embedded antenna after printing. The structural material comprises acrylonitrile butadiene styrene (ABS) and the device/conductive filament is extruded from an organic-ester based silver ink formulation, such as described below. The silver ink is deposited into channels of about 0.5 mm in depth and about 1 mm in width that are fabricated in a bottom portion of the 3D structure, which comprises five layers upon completion of printing.

3D Printed Embedded Circuit and Printed Circuit Board

Figure 8A:
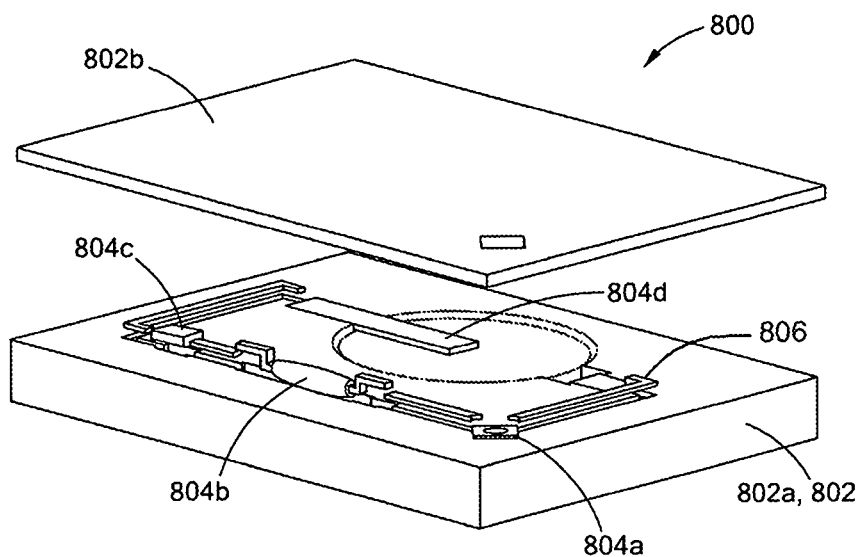
FIG. 8A is a schematic illustration of a 3D printed circuit board that includes a surface mount resistor, magnetic read switch, surface mount LED, and battery partially embedded in a polymeric structural material and interconnected with conductive filaments extruded from a silver ink formulation.
Figure 8B:
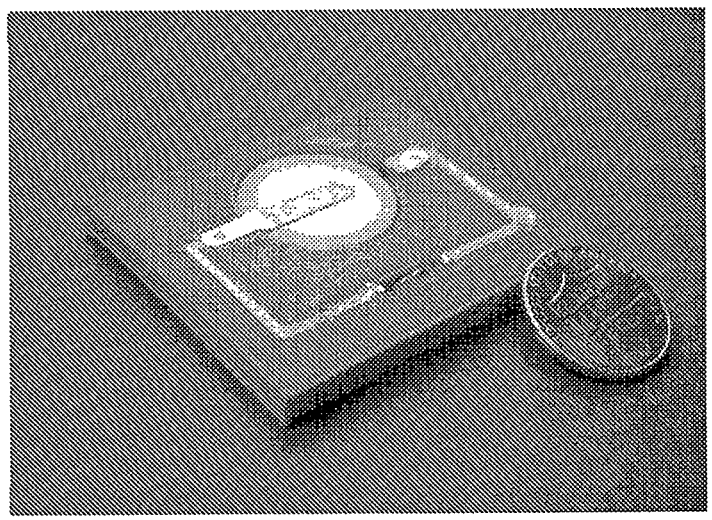
FIG. 8B is an optical image of the bottom portion of the 3D printed functional part shown schematically in FIG. 8A, where the circuit components and conductive filaments are partially embedded in a polymeric structural material.
Figure 8C:
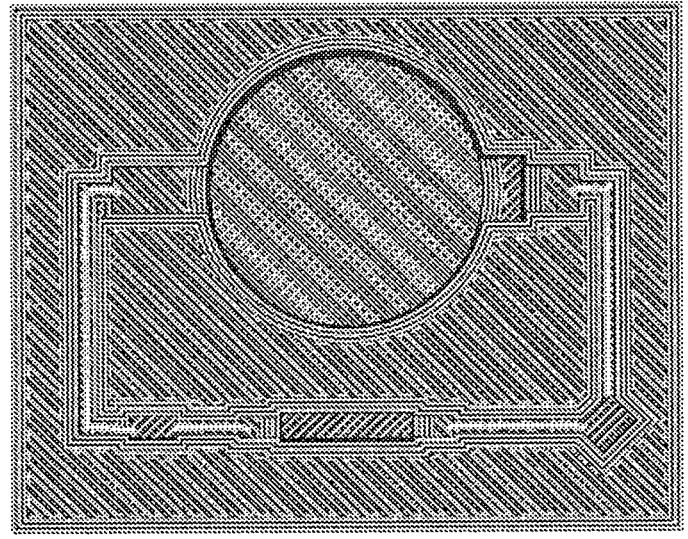
FIG. 8C shows a multi-material print head tool path for printing both the polymeric structural filaments and the conductive filaments.
Figure 8D:
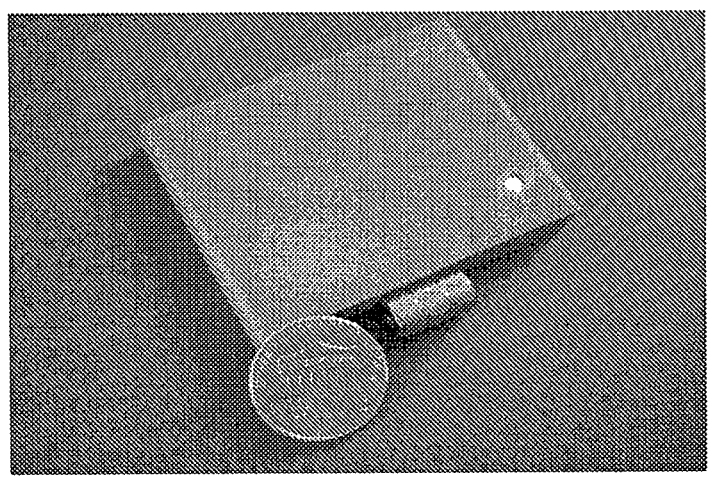
FIG. 8D is an optical image of a 3D printed, fully embedded circuit (after 3D printing a top portion over the bottom portion shown in FIG. 8A), where the LED is switched on by a magnet placed in close proximity to the magnetic read switch and a penny is shown to indicate the size scale.

FIG. 8A shows an exemplary 3D printed PCB (without top portion) or embedded circuit (with top portion 802b) that includes a light emitting diode (LED) 804a, a magnetic read switch 804b, a resistor 804c to limit power consumption, and a battery 804d to power the LED 804a. FIG. 8B is an optical image of the bottom portion 802a of the structure 802 shown in FIG. 8A, where the circuit components 804a,804b, 804c,804d and interconnects 806 are partially embedded in the bottom portion 802a. FIG. 8C shows the print path used for fabrication of the 3D functional part 800, which is printed in two conformations: (1) partially embedded to demonstrate the ability to 3D print parts such as PCBs; and (2) fully embedded to demonstrate the ability to create 3D circuits that are completely encased within a thermoplastic matrix. FIG. 8D shows an exemplary fully embedded circuit, which includes an LED switched on by a magnet placed in close proximity to (within about 1 cm of) the magnetic read switch. The finished 3D printed embedded circuit includes 25 layers. In these examples, the matrix or structural material comprises polylactic acid (PLA) or acrylonitrile butadiene styrene (ABS) and the conductive filaments (or conductive traces) comprise silver. The conductive filaments are extruded from an organic-ester based silver ink formulation, such as described below, and deposited into channels of about 0.5 mm in depth and about 1 mm in width. A nozzle diameter of 0.4 ID and a print speed of 30 mm/s are employed to 3D print the structural filaments and a nozzle diameter of 0.3 mm ID and a print speed of 4 mm/s are used to 3D print the conductive filaments. The LED, magnetic read switch, resistor and battery may be snap-fitted into the bottom portion of the 3D printed structure by hand.

3D Printed Torque Wrench with Embedded Strain Sensor

Figure 9A:
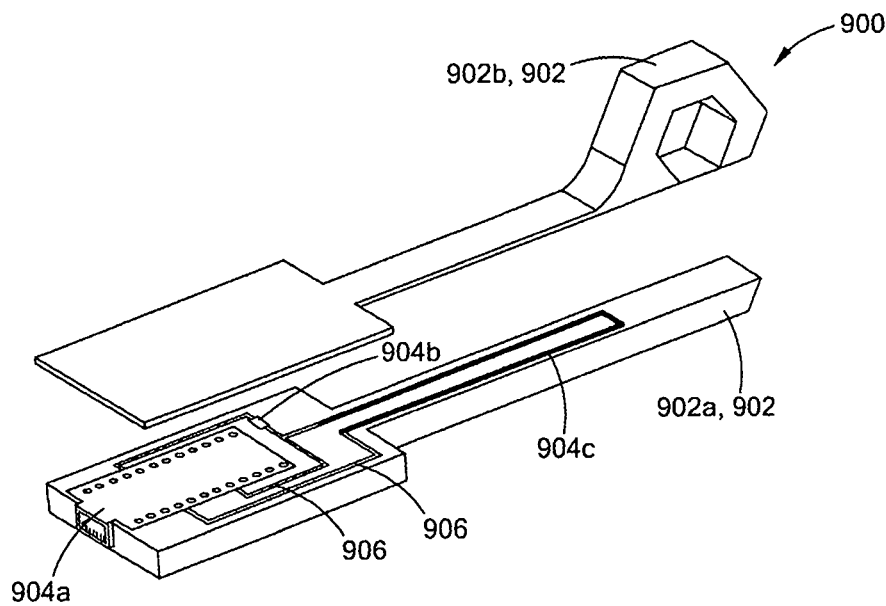
FIG. 9A is schematic illustration of a 3D printed torque wrench strain sensing device which includes, in this example, an Arduino board, surface mount resistor, strain sensor, and conductive filaments (interconnects) embedded within a structural matrix material.
Figure 9B:
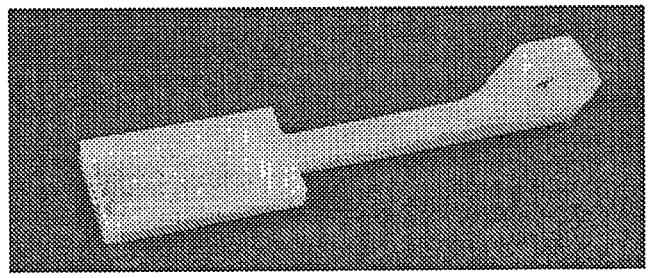
FIG. 9B is an optical image of the 3D printed torque wrench strain sensing device.
Figure 9C:
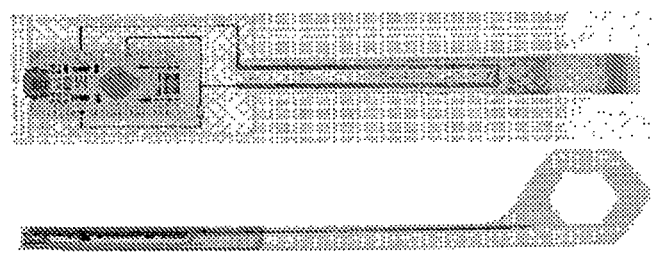
FIG. 9C shows a computerized tomography (CT) scan of the 3D printed wrench (top view and side view), which highlights the embedded circuitry and individual electrical components.
Figure 9D:
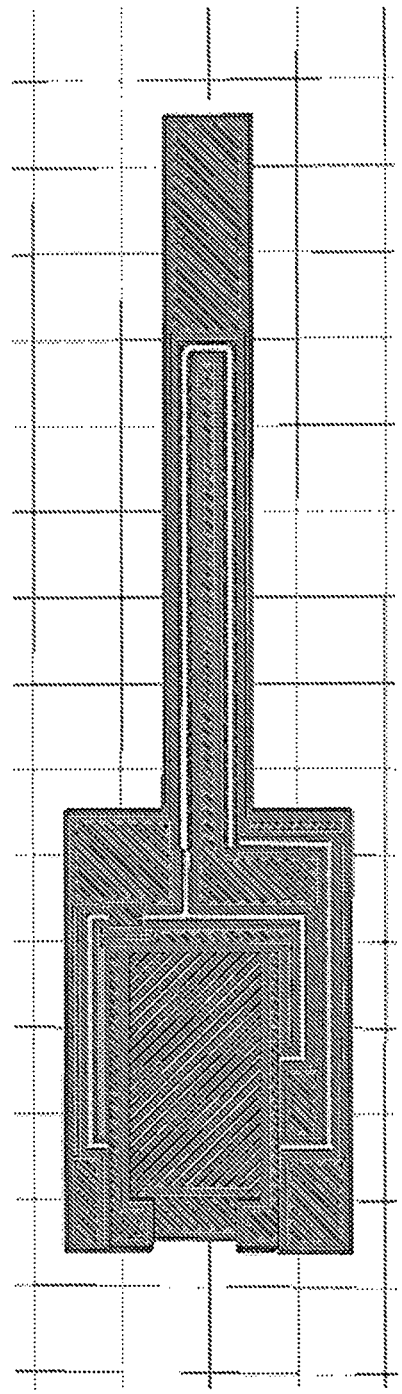
FIG. 9D shows an exemplary multi-material print path used for constructing the polymeric 3D structure, the conductive interconnects and the strain sensor.

FIGS. 9A-9C show an exemplary 3D printed torque wrench strain sensing device 900 that includes an Arduino board 904a, surface mount resistor 904b, strain sensor 904c comprising silver-doped silicone, silver conductive filaments 906, and bottom and top portions 902a, 902b of a matrix or structural body 902 made from PLA. FIG. 9D shows an exemplary multi-material print path used for construction of an embedded circuit and sensor.

The torque wrench strain sensing device demonstrates several concepts central to the creation of 3D functional parts. The first concept is the ability to co-print conductive interconnects and sensors within a single device comprising a printed thermoplastic matrix. The second concept is seamlessly embedding these features within an arbitrarily designed, 3D printed functional part. The third concept is the demonstration of embedding a programmable processor into the 3D printed component that is capable of analyzing activity experienced by the device. A torque wrench capable of strain sensing was selected as a representative embodiment of these central concepts.

Figure 9E:
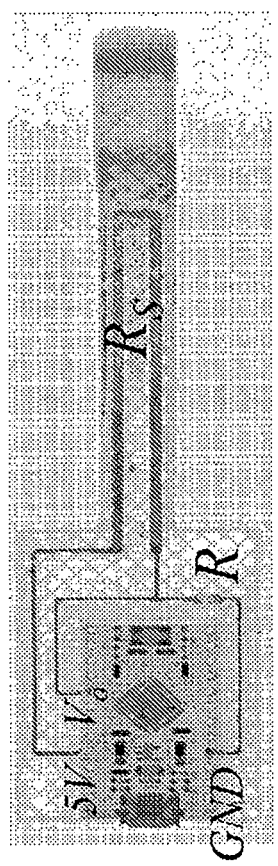
FIG. 9E shows a top view CT scan of the 3D printed wrench with markings to indicate circuit elements.

The main body of the torque wrench is produced by 3D printing a thermoplastic matrix, where the infill percentage and thickness of the neck can be varied to give the desired amount of flex for the targeted amount of applied torque. Within the neck region of the torque wrench, a silicone ink doped with conductive silver particles is printed along the print paths shown in FIG. 9D. The ink is commercially available from Silicone Solutions (Cuyahoga Falls, Ohio) under the product name SS-261. The distance of the strain sensor from the neutral axis is arbitrarily chosen to be 3 mm; however, the distance can be varied to minimize or maximize the strain experienced by the embedded sensor. A surface mount resistor with known resistance is also incorporated into the wrench, wired in series with the strain sensor. When the voltage between the strain sensor and a resistor of known resistance is monitored, the resistance of an unknown resistor can be estimated according to the equation provided below. In addition, a programmable Arduino board with an analog voltage reading pin is incorporated into the device to monitor the voltage change between the resistors (see FIG. 9E).

Equating and rearranging for $R_s$ yields:

$$R_s = R\left(\frac{V}{V_o} - 1\right)$$

where R is the known resistor, the voltage (V) is 5V, and $V_o$ is the voltage measured by the analog voltage pin on the Arduino board. The Arduino board includes a surface mount LED that can be modulated in intensity or flash frequency to indicate the amount of strain being experienced by the sensor.

3D Printed Arduino Board

FIG. 10 shows an optical image of a 3D printed, custom-designed Arduino board fabricated using the dual-head desktop 3D electronics printer described above. The thermoplastic board is printed using an FFF head equipped with 400 micron nozzle at a speed of 30 mm/s. The conductive silver traces are printed by depositing the silver ink through a 250 micron nozzle at a speed of 4 mm/s. Resistors and capacitors are placed into open cavities on the board prior to printing the conductive silver traces. The remaining components, including an atmel 328-Au-ND chip, are hand mounted after printing.

Exemplary Silver Ink Formulations

Organic Ester-Based Formulations

Example 1

Figure 11A:
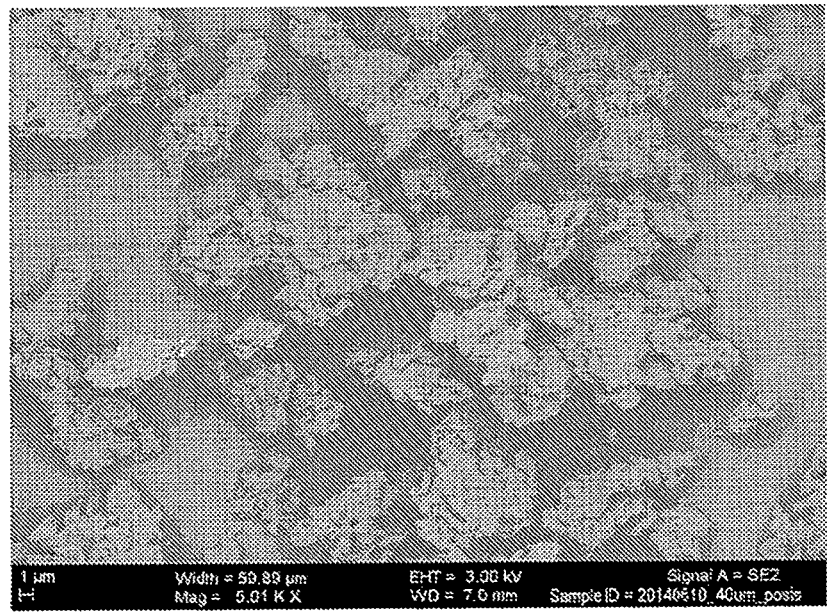
FIG. 11A shows a scanning electron microscope (SEM) image of an exemplary sample of dry silver flakes prior to incorporation into a conductive ink formulation.
Figure 12A:
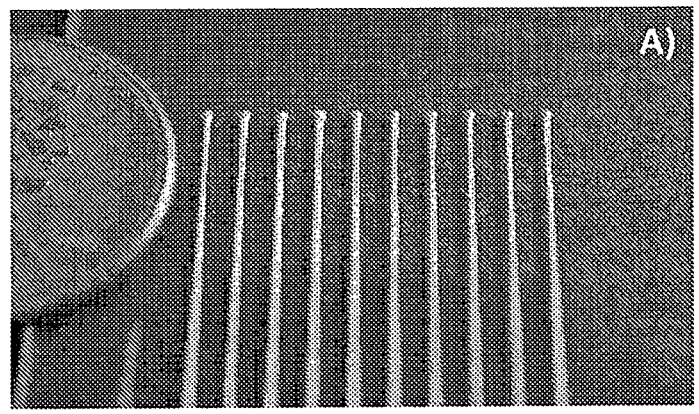
FIG. 12A is a photograph of conductive traces of an exemplary organic ester-based silver ink after printing onto a glass substrate using a nozzle with an internal diameter (ID) of 250 μm.
Figure 12B:
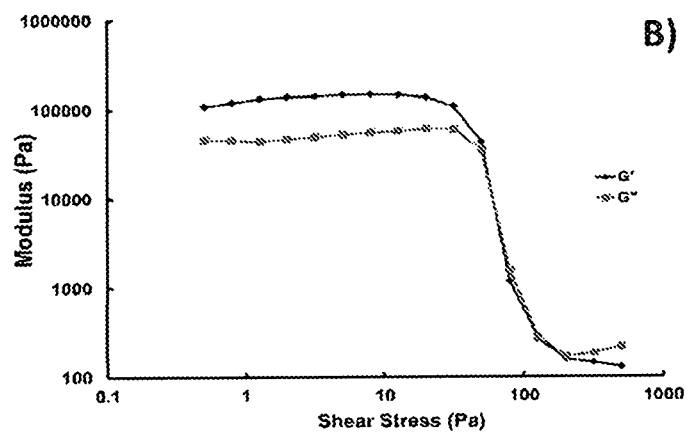
FIG. 12B is a plot of storage modulus and loss modulus versus applied shear stress for the silver ink shown in FIG. 12A.
Figure 12C:
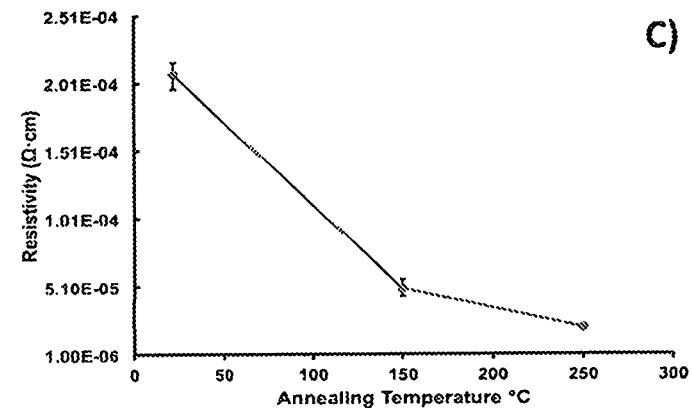
FIG. 12C is a plot of conductivity versus annealing temperature for the silver ink shown in FIG. 12A.

In this example, 11 g of silver flake (5-8 micron diameter/width) capped with long-chain fatty acid residues (see FIG. 11A), 1.25 g pentyl acetate, 0.203 g nitrocellulose, and 0.5 g nitrocellulose additives are mixed together to form a silver ink suitable for 3D printing the above-described exemplary parts. FIG. 12A is a photograph of conductive traces (conductive filaments) of the silver ink printed onto a glass substrate using a nozzle with an internal diameter (ID) of 250 μm. The storage modulus and loss modulus of the silver ink versus applied shear stress is shown in FIG. 12B, and FIG. 12C shows a plot of conductivity versus annealing temperature for the silver ink, where the annealing time was 15 minutes for all elevated temperatures.

Example 2

In another example, carbon nanotubes (CNT) are incorporated into the silver ink formulation. Multi-wall carbon nanotubes functionalized with carboxyl groups are dispersed in the solvent of choice by sonicating under an ultrasonic horn for 10 minutes. In this example, the solvent is pentyl acetate, and the MWCNT-COOH are dispersed at a concentration of 5 wt. % CNT in pentyl acetate. Then, an aliquot of the CNT dispersion sufficient to give the correct final ratio of CNT:Ag is placed into a container and mixed thoroughly with 15 wt. % nitrocellulose solution dispersed in the solvent. Next, additional solvent is added to meet the percentages described below. Next, silver is added in five or less gram increments while mixing for two minutes in a Thinky planetary centrifugal mixer in between Ag additions. The final ink composition includes: 19.23 wt. % pentyl acetate, 1.51 wt. % nitrocellulose (11.8-12.3% nitrogen; Brand: Synthesia E9), 78.38 wt. % Ag flake (2-4 microns in diameter and capped with oleic acid), 0.88 wt % carboxyl functionalized multiwalled carbon nanotubes (length of about 10-20 microns and outer diameter of about 30-50 nm).

Figure 11B:
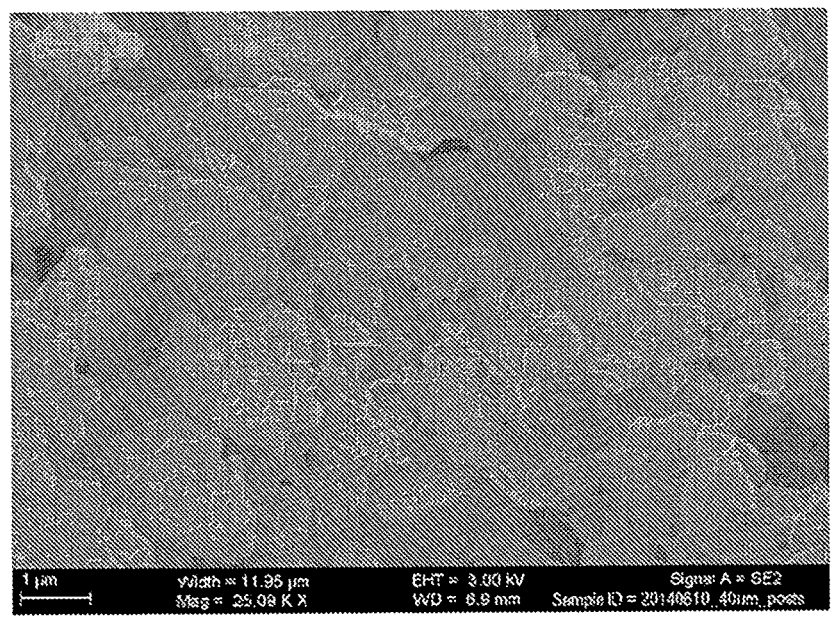
FIG. 11B shows an SEM image of an extruded conductive filament comprising Ag flakes and about 1 wt. % carbon nanotubes functionalized with —COOH groups.
Figure 12D:
FIG. 12D shows an optical image of the conductive filament of FIG. 11B partially unsupported along its length.
Figure 13:
FIG. 13 is a photograph of a customized 3D printer including a dual printhead designed and built at Harvard University.

FIG. 12D shows an optical image of a spanning conductive filament produced by 3D printing the pentyl acetate-based silver ink formulation containing 1 wt. % CNT-COOH by weight of silver, as described above. The printed feature spans an unsupported gap of that exceeds 1 cm. An SEM image of the CNT-reinforced silver filament is shown in FIG. 11B.

Example 3

The ink formulation described in this example is used to 3D print the Arduino board described above, although the solvent is changed to propylene carbonate to slow the evaporation rate. This modification reduces clogging of the nozzle, which is uncapped for deposition. The traces are then cured in an oven at 60° C. for 15 minutes to expedite drying of the extruded filaments. The exemplary ink formulation includes: 17.37 wt. % propylene carbonate, 1.51 wt. % nitrocellulose (11.8-12.3% nitrogen; Brand: Synthesia E9), 80.91 wt. % Ag flake (2-4 microns in diameter and capped with oleic acid), 0.21 wt. % carboxyl functionalized multi-walled carbon nanotubes (length of 10-20 microns and outer diameter of about 30-50 nm).

Water-Based Formulation

In this example, silver powder is milled, washed and then dispersed in aqueous media. The milling formulation includes 10 g silver powder (2-3.5 μm diameter/width), 2.1 g PVP Mw=40,000, and 100 mL deionized (DI) water. The milling media include 12 mm and 2 mm diameter YZP spherical milling media and the milling time is 60 hours at 100 RPM. After milling, the silver flakes are washed three times in water with centrifuging in between. The composition of the final formulation includes: 5.33 g milled silver flake coated with PVP, 0.1066 g hydroxypropyl cellulose Mw=100,000, 0.054 g hydroxypropyl cellulose Mw=1,000,000, and 2.754 g DI $H_2O$.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A printed three-dimensional (3D) functional part comprising:
a 3D structure comprising a structural material; at least one functional electronic device at least partially embedded in the 3D structure and having a base secured against an interior surface thereof; and one or more conductive filaments at least partially embedded in the 3D structure and electrically connected to the at least one functional electronic device, wherein each of the one or more conductive filaments comprises a percolating network of conductive particles, and wherein at least one of the one or more conductive filaments is unsupported by the 3D structure along only a portion of a length thereof.

2. The printed 3D functional part of claim 1, wherein the at least one functional electronic device is selected from the group consisting of electromechanical components, electrochemical components, active electronic components, passive electronic components, and integrated circuits.

3. The printed 3D functional part of claim 1, comprising a plurality of the functional electronic devices, each of the functional electronic devices having a base secured against the interior surface of the 3D structure.

4. The printed 3D functional part of claim 1, wherein at least one of the one or more conductive filaments follows a nonplanar pathway between connection points.

5. The printed 3D functional part of claim 1, wherein each of the one or more conductive filaments comprises a diameter or width of about 500 microns or less.

6. The printed 3D functional part of claim 1, wherein each of the one or more conductive filaments is an extruded filament.

7. The printed 3D functional part of claim 1, wherein each of the one or more conductive filaments has a substantially cylindrical shape.

8. The printed 3D functional part of claim 1, wherein a transverse cross-sectional shape of each of the one or more conductive filaments is a curved shape without corners.

9. The printed 3D functional part of claim 1, wherein the one or more conductive filaments comprise a conductive material selected from the group consisting of: silver, copper, lead, tin, lithium, cobalt, gold, platinum, palladium, titanium, molybdenum, tungsten, tantalum, rhenium, zirconium, vanadium, chromium, niobium, iron, nickel, zinc, aluminum, magnesium, and carbon.

10. The printed 3D functional part of claim 9, wherein the conductive particles comprise silver flakes.

11. The printed 3D functional part of claim 1, wherein each of the one or more conductive filaments exhibits a conductivity of at least about 2.5% a bulk conductivity of the conductive material.

12. The printed 3D functional part of claim 1, wherein the structural material comprises a polymer.

13. The printed 3D functional part of claim 12, wherein the polymer is selected from the group consisting of consisting of acrylonitrile butadiene styrene (ABS), polylactic acid (PLA), poly(methyl methacrylate) (PMMA), epoxy, polydimethylsiloxane (PDMS), polyimide (Nylon), polyimide (PI), polyethylene (PE), polypropylene (PP), polystyrene (PS), polytetrafluorethylene (PTFE), polyvinylchloride (PVC), polyurethane PU), polycarbonate (PC), photocurable resins, epoxies, and hydrogels.

14. The printed 3D functional part of claim 1, wherein the structural material comprises a ceramic.

15. The printed 3D functional part of claim 14, wherein the ceramic is selected from the group consisting of oxides, carbides, borides, nitrides, and silicides.

16. The printed 3D functional part of claim 1, wherein the structural material comprises a composite.

17. The printed 3D functional part of claim 16, wherein the composite comprises filler particles comprising a ceramic or glass incorporated in a polymeric matrix.

18. The printed 3D functional part of claim 3, wherein the base of at least one of the functional electronic devices is oriented at a non-zero angle with respect to the bases of other of the functional electronic devices.

19. The printed 3D functional part of claim 1 comprising a hearing aid or a cell phone housing.

20. A printed three-dimensional (3D) functional part comprising:
a 3D structure comprising a structural material; at least one functional electronic device at least partially embedded in the 3D structure and having a base secured against an interior surface thereof; and one or more conductive filaments at least partially embedded in the 3D structure and electrically connected to the at least one functional electronic device, wherein at least one of the one or more conductive filaments is unsupported by the 3D structure along only a portion of a length thereof.

21. The printed three-dimensional (3D) functional part of claim 20, wherein the one or more conductive filaments comprise from about 70 wt. % to about 99.9 wt. % conductive particles.

* * * * *

UNITED STATES PATENT AND TRADEMARK OFFICE
CERTIFICATE OF CORRECTION

PATENT NO. : 10,462,907 B2
APPLICATION NO. : 14/900860
DATED : October 29, 2019
INVENTOR(S) : Jennifer A. Lewis et al.

Page 1 of 1

It is certified that error appears in the above-identified patent and that said Letters Patent is hereby corrected as shown below:

In the Claims

In Column 22, Claim 13, Line 15, delete "polyimide" and replace with -- polyamide --.

Signed and Sealed this
Seventeenth Day of December, 2019

Andrei Iancu
*Director of the United States Patent and Trademark Office*